(12) United States Patent
Sung et al.

(10) Patent No.: US 10,147,760 B2
(45) Date of Patent: Dec. 4, 2018

(54) LIGHT-EMITTING DEVICES

(71) Applicant: Samsung Electronics Co., Ltd., Suwon-si, Gyeonggi-do (KR)

(72) Inventors: Young-kyu Sung, Hwaseong-si (KR); Jae-ryung Yoo, Suwon-si (KR); Seung-wan Chae, Yongin-si (KR); Jae-young Lee, Suwon-si (KR); In-bum Yang, Yongin-si (KR); Min-gu Ko, Yongin-si (KR); Sung-wook Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/607,930

(22) Filed: May 30, 2017

(65) Prior Publication Data

US 2018/0166498 A1 Jun. 14, 2018

(30) Foreign Application Priority Data

Dec. 8, 2016 (KR) .......................... 10-2016-0166885

(51) Int. Cl.
*H01L 29/18* (2006.01)
*H01L 33/00* (2010.01)
(Continued)

(52) U.S. Cl.
CPC .............. *H01L 27/15* (2013.01); *H01L 33/20* (2013.01); *H01L 33/385* (2013.01)

(58) Field of Classification Search
USPC .............................. 257/13, 40, 79–103, 918, 257/E51.015–E51.022, E33.001–E33.077, (Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 20140140803 A 12/2014

*Primary Examiner* — Tram H Nguyen
(74) *Attorney, Agent, or Firm* — Harness, Dickey & Pierce, PLC

(57) ABSTRACT

A light-emitting device may include separate, first and second light-emitting structures that are isolated from direct contact with each other on a phototransmissive substrate. Each light-emitting structure may include a first conductivity-type semiconductor layer, an active layer on the first conductivity-type semiconductor layer, and a second conductivity-type semiconductor layer on the active layer. The first and second light-emitting structures may be electrically connected to each other. An inter-structure conductive layer may electrically interconnect the first conductivity-type semiconductor layer of the first light-emitting structure to the second conductivity-type semiconductor layer of the second light-emitting structure. The second light-emitting structure may include a finger structure extending from an outer edge of the second light-emitting structure toward an interior of the second light-emitting structure. The second light-emitting structure may include island structures that are isolated from direct contact with each other and a bridge structure between adjacent island structures.

17 Claims, 19 Drawing Sheets

(51) Int. Cl.
  *H01L 27/15* (2006.01)
  *H01L 33/38* (2010.01)
  *H01L 33/20* (2010.01)

(58) Field of Classification Search
  USPC .................. 257/E33.054, E25.028, E25.032; 438/22–47, 69, 493, 503, 507, 956
  See application file for complete search history.

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,009,199 B2 | 3/2006 | Hall |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,285,801 B2 | 10/2007 | Eliashevich et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,354,680 B2 | 1/2013 | Kai et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,093,293 B2 | 7/2015 | Ibbetson et al. |
| 9,349,912 B2 | 5/2016 | Ye et al. |
| 9,368,548 B2 | 6/2016 | Lee |
| 9,412,922 B2 | 8/2016 | Jang et al. |
| 2012/0211793 A1* | 8/2012 | Bergmann .............. H01L 24/29 257/99 |
| 2012/0228580 A1* | 9/2012 | Wang .................... H01L 27/156 257/13 |
| 2015/0187997 A1* | 7/2015 | Fan ........................ H01L 33/38 257/99 |

* cited by examiner

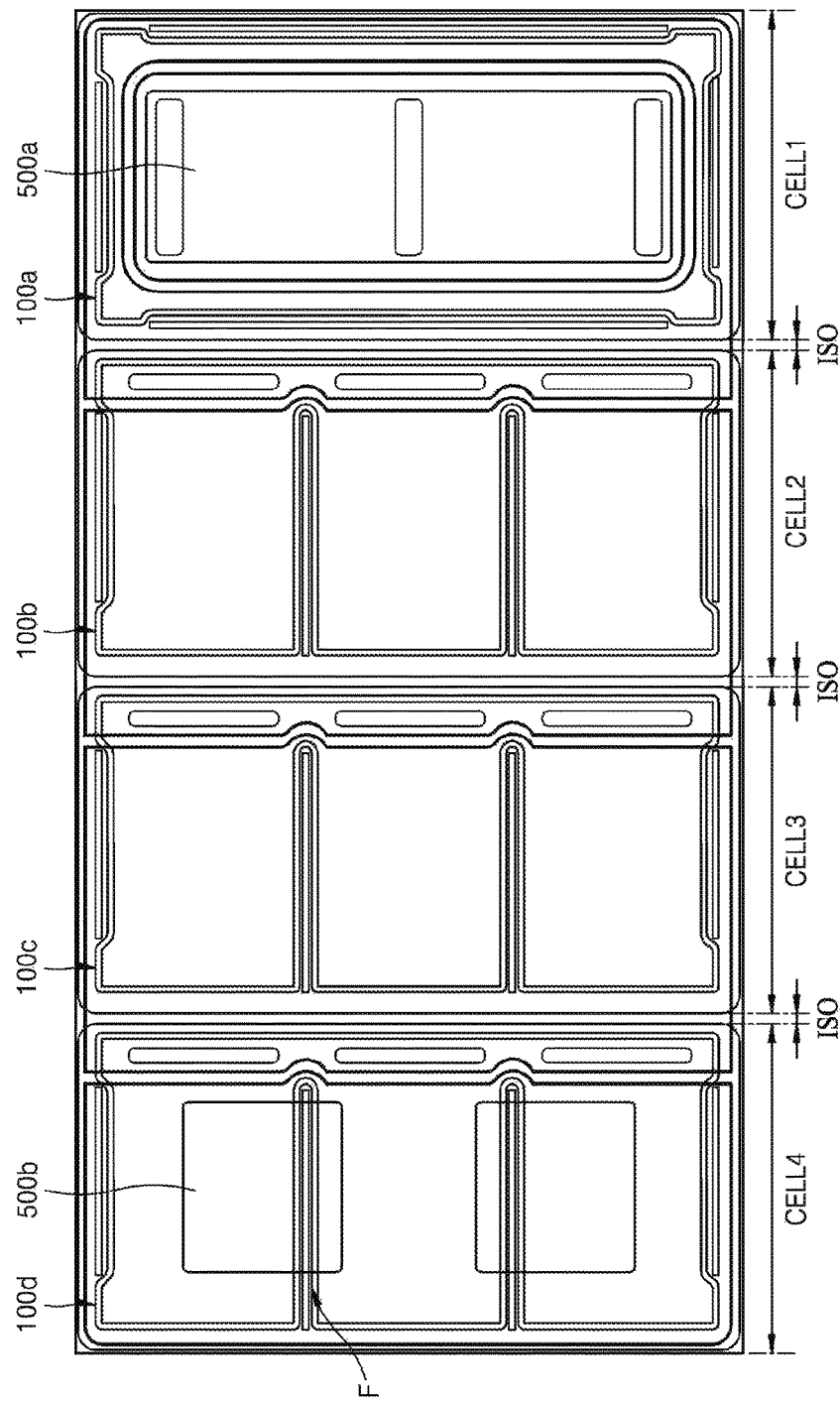

LIGHT-EMITTING DEVICES

CROSS-REFERENCE TO RELATED APPLICATIONS

This application claims the benefit, under 35 U.S.C. § 119, of Korean Patent Application No. 10-2016-0166885, filed on Dec. 8, 2016, in the Korean Intellectual Property Office, the disclosure of which is incorporated herein in its entirety by reference.

BACKGROUND

The inventive concepts relate to light-emitting devices, and more particularly, to light-emitting devices including a plurality of light-emitting diodes connected in series.

Generally, light-emitting devices (LEDs) are widely used as light sources due to various advantages, such as low power consumption and high brightness. For example, semiconductor light-emitting devices have recently been employed as backlight devices for illumination apparatuses and large liquid crystal displays (LCDs).

In order to provide improved efficiency, an LED may include multiple LED chips that are connected to one another in series. In some cases, when individual LED chips are connected in series, processes of forming the LED may include a substrate separating process and a packaging process regarding separated LED chips, and processes including a mounting process for arranging respective packages on a substrate and a wiring process for wiring electrodes of packages. Therefore, manufacturing process time and manufacturing costs associated with an LED including multiple LED chips connected in series may be increased in relation to an LED that includes an individual LED chip.

SUMMARY

The inventive concepts provide a light-emitting device having improved reliability.

The inventive concepts provide a light-emitting device with improved light-emitting efficiency.

According to some example embodiments of the inventive concepts, a light-emitting device may include a first light-emitting structure and a second light-emitting structure on a phototransmissive substrate. The first light-emitting structure and the second light-emitting structure may be isolated from direct contact with each other. The first light-emitting structure and the second light-emitting structure may each include a first conductivity-type semiconductor layer, an active layer on the first conductivity-type semiconductor layer, and a second conductivity-type semiconductor layer on the active layer. The light-emitting device may further include an inter-structure conductive layer configured to electrically interconnect the first conductivity-type semiconductor layer of the first light-emitting structure to the second conductivity-type semiconductor layer of the second light-emitting structure. The second light-emitting structure may include a finger structure extending from an outer edge of the second light-emitting structure toward an interior of the second light-emitting structure.

According to some example embodiments of the inventive concepts, a light-emitting device may include a phototransmissive substrate and a first light-emitting structure and a second light-emitting structure on the phototransmissive substrate. The first light-emitting structure and the second light-emitting structure may be isolated from direct contact with each other in a first direction. The first direction may be parallel to a surface of the phototransmissive substrate. The first light-emitting structure and the second light-emitting structure may each include a first conductivity-type semiconductor layer, an active layer on the first conductivity-type semiconductor layer, and a second conductivity-type semiconductor layer on the active layer. The first conductivity-type semiconductor layer of the first light-emitting structure and the second conductivity-type semiconductor layer of the second light-emitting structure are configured to be electrically connected to each other. The second light-emitting structure may include a plurality of island structures that are isolated from direct contact with each other in a second direction, the second direction parallel to the surface of the phototransmissive substrate and intersecting with the first direction, and a bridge structure between adjacent island structures of the plurality of island structures.

According to some example embodiments of the inventive concepts, a light-emitting device may include a first light-emitting structure on a phototransmissive substrate and a second light-emitting structure on the phototransmissive substrate. The second light-emitting structure may be isolated from direct contact with the first light-emitting structure. The second light-emitting structure may include a plurality of island structures that are isolated from direct contact with each other and a bridge structure between adjacent island structures of the plurality of island structures. The first light-emitting structure and the second light-emitting structure may be configured to be electrically connected to each other.

BRIEF DESCRIPTION OF THE DRAWINGS

Embodiments of the inventive concepts will be more clearly understood from the following detailed description taken in conjunction with the accompanying drawings in which:

FIG. 13B is a layout diagram of the light-emitting device of FIG. 13A;

DETAILED DESCRIPTION OF THE EMBODIMENTS

Figure 1:
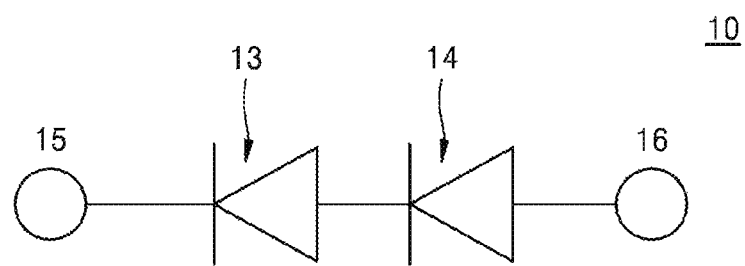
FIG. 1 is a schematic circuit diagram showing a light-emitting device according to some example embodiments of the inventive concepts.

FIG. 1 is a schematic circuit diagram showing a light-emitting device 10 according to some example embodiments of the inventive concepts.

Referring to FIG. 1, the light-emitting device 10 may include first and second light-emitting diodes (LEDs) 13 and 14. The first and second LEDs 13 and 14 may be connected in series between first and second external terminals 15 and 16. The P node of the first LED 13 may be electrically connected to the first external terminal 15. The N node of the second LED 14 may be electrically connected to the second external terminal 16. The N-node of the first LED 13 may be connected to the P-node of the second LED 14. As a result, two active layers are between adjacent external terminals.

When a voltage drop corresponding to one LED is denoted by Vd, the light-emitting device 10 shown in FIG. 1 includes two LEDs connected in series, and thus a voltage drop of 2Vd occurs between the first and second external terminals 15 and 16. For example, when the voltage drop corresponding to one LED is 3V, a voltage drop of 6V may occur between the first and second external terminals 15 and 16 due to the two LEDs connected in series. As a result, an AC voltage may be converted to a high DC voltage via an AC-DC conversion, and thus the efficiency for converting commercial AC power to DC may be improved.

Figure 2:
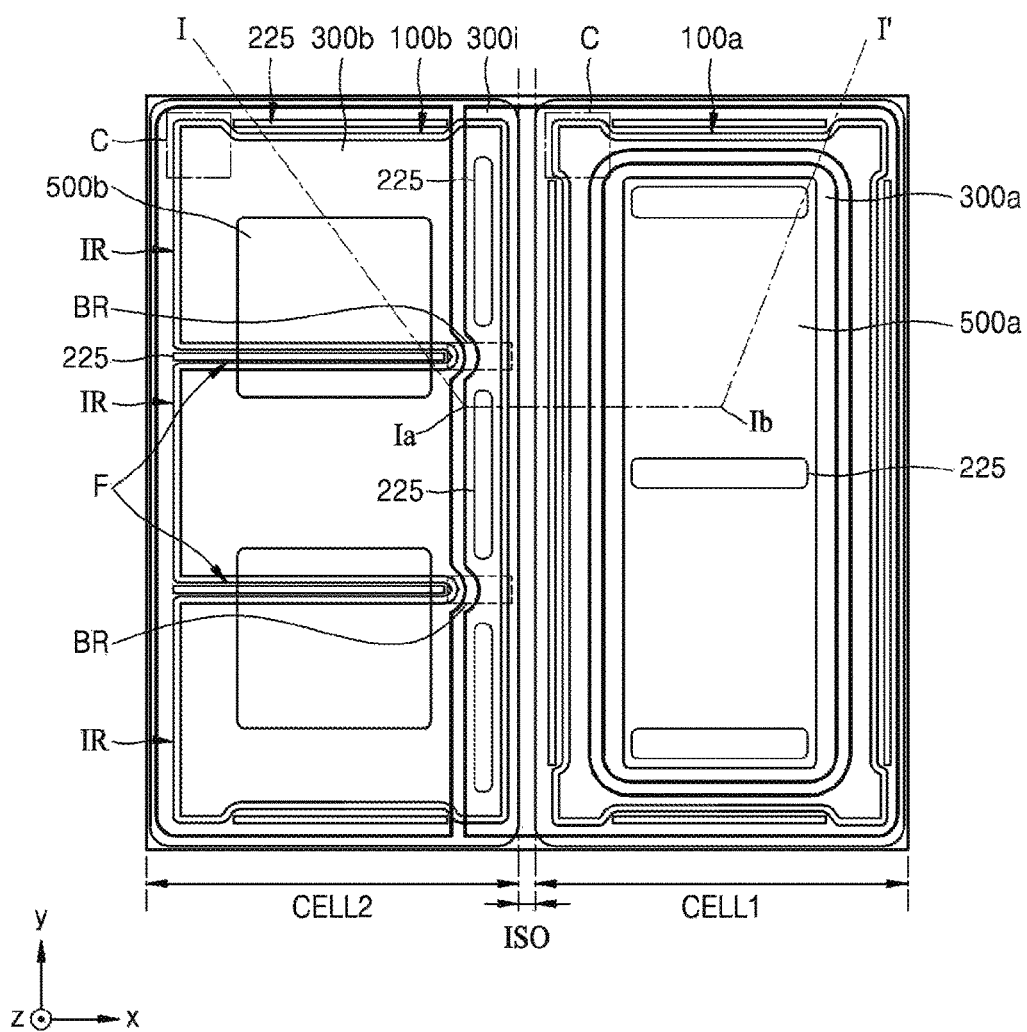
FIG. 2 is a schematic layout diagram showing the light-emitting device according to some example embodiments of the inventive concept
Figure 3:
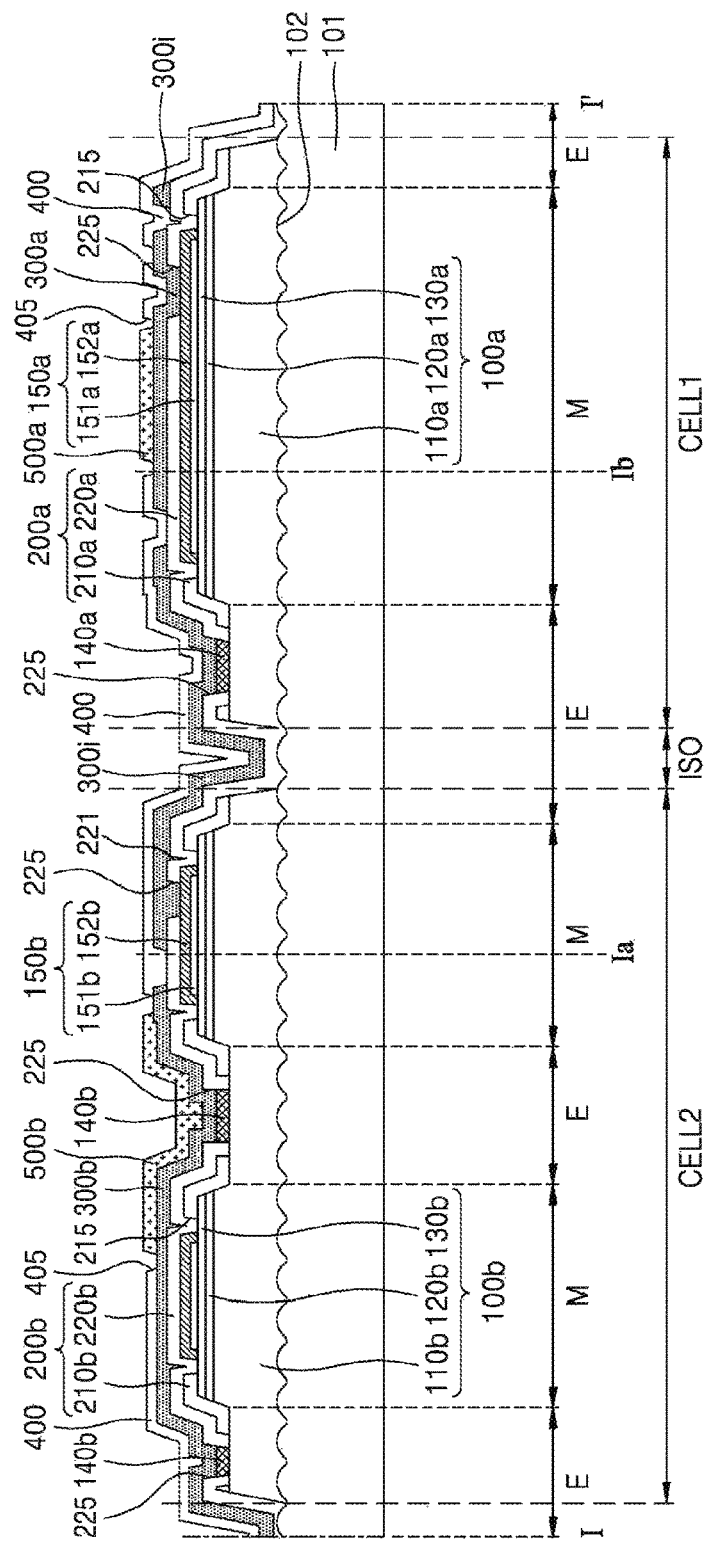
FIG. 3 is a cross-sectional diagram, taken along a line I-I' of FIG. 2.

FIG. 2 is a schematic layout diagram showing the light-emitting device 10 according to some example embodiments of the inventive concepts. FIG. 3 is a cross-sectional diagram, taken along a line I-I' of FIG. 2.

Referring to FIGS. 2 and 3, the light-emitting device 10 according to some example embodiments of the inventive concepts (also referred to herein as a semiconductor light-emitting device) may include a substrate 101, first and second light-emitting structures 100a and 100b, first insulation patterns 200a and 200b, first and second conductive layers 300a and 300b, an inter-structure conductive layer 300i, a second insulation pattern 400, and first and second electrodes 500a and 500b.

The substrate 101 may be provided as a substrate for growing a light-emitting structure and may include an insulating material or semiconductor material, such as sapphire, Si, SiC, $MgAl_2O_4$, MgO, $LiAlO_2$, $LiGaO_2$, or GaN. However, the inventive concepts are not limited thereto. In some cases, the substrate 101 may be conductive. Sapphire, which is widely used for a substrate for nitride semiconductor growth, is a crystal having electrical conductivity, having hexagonal-rhombo (Hexa-Rhombo R3c) symmetry, having lattice constants of 13.001 Å and 4.758 Å in the c-axis direction and the a-axis direction, and including a C(0001) plane, an A(1120) plane, and an R (1102) plane. In this case, the C plane is one where it is relatively easy to grow a nitride thin film thereon and is stable at high temperature, and thus, the C plane is mainly used as a substrate for nitride growth.

As shown in FIGS. 2 and 3, a plurality of concavo-convex structures 102 may be disposed on the top surface of the substrate 101, that is, the surface on which the first and second light-emitting structures 100a and 100b are disposed, where the crystallinity and light-emitting efficiency of semiconductor layers may be improved by the concavo-convex structures 102. Although in FIG. 3 the concavo-convex structure 102 has a dome-like convex shape, the inventive concepts are not limited thereto. For example, the concavo-convex structure 102 may have various shapes, e.g., a square shape, a triangular shape, etc. The concavo-convex structures 102 may be selectively disposed and may also be omitted.

Two directions that are parallel to the top surface of the substrate 101 and cross each other are defined as a first direction (x direction) and a second direction (y direction), whereas a direction substantially perpendicular (e.g., perpendicular within manufacturing tolerances and/or material tolerances) to the top surface of the substrate 101 is defined as a third direction (z direction). For example, the first direction (x direction) and the second direction (y direction) may cross each other substantially perpendicularly (e.g., perpendicularly within manufacturing tolerances and/or material tolerances). The first direction (x direction) and the second direction (y direction) are directions substantially perpendicular (e.g., perpendicular within manufacturing tolerances and/or material tolerances) to the third direction (z direction). In the drawings, a direction indicated by an arrow and a direction opposite thereto will be described as a same direction. The above-stated definition of directions applies to all subsequent drawings.

The substrate 101 may include a first cell region CELL1, a second cell region CELL2 apart from the first cell region CELL1 in the first direction (x direction), and an isolating region ISO between the first cell region CELL1 and the second cell region CELL2. The first light-emitting structure 100a may be disposed on the first cell region CELL1 and the second light-emitting structure 100b may be disposed on the second cell region CELL2. According to some embodiments, the first cell region CELL1 may correspond to the first LED 13 described above with reference to FIG. 1, whereas the second cell region CELL2 may correspond to the second LED 14 described above with reference to FIG. 1. According to some other embodiments, the first cell region CELL1 may correspond to the second LED 14 described above with reference to FIG. 1, whereas the second cell region CELL2 may correspond to the first LED 13 described above with reference to FIG. 1.

The substrate 101 may selectively be removed in a later process. In other words, the substrate 101 may be provided as a growth substrate for growing first conductivity-type semiconductor layers 110a and 110b, active layers 120a and 120b, and second conductivity-type semiconductor layers 130a and 130b and then removed by a separating process. Particularly, when the substrate 101 is conductive, the substrate 101 may be removed to limit and/or prevent a short circuit between the first and second light-emitting structures 100a and 100b. The substrate 101 may be separated from the first and second light-emitting structures 100a and 100b by using a method, such as a laser lift-off or a chemical lift-off.

Although not shown, a buffer layer may be further disposed on the top surface of the substrate 101. The buffer layer is for reducing lattice defect of a semiconductor layer grown on the substrate 101 and may be an undoped semiconductor layer including a nitride. The buffer layer reduces a difference between lattice constants of the substrate 101 including sapphire and the first conductivity-type semiconductor layers 110a and 110b that include GaN and are stacked on the top surface of the substrate 101, thereby increasing crystallinity of first conductivity-type semiconductor layers 110a and 110b which are GaN layers. The buffer layer may include undoped GaN, AlN, or InGaN and may be disposed by being grown at a low temperature from about 500° C. to about 600° C. to a thickness from dozens to hundreds of A. Being undoped means that no separate impurity doping process is performed on a semiconductor layer. When a semiconductor layer is grown at an impurity concentration equivalent to the original impurity concentration of the semiconductor layer e.g., when a gallium nitride semiconductor is grown via metal organic chemical vapor deposition (MOCVD), a dopant, such as Si, may be included therein at a level from about $10^{14}/cm^3$ to about $10^{18}/cm^3$, intentionally or unintentionally. However, such a buffer layer may be omitted in some example embodiments.

The first and second light-emitting structures 100a and 100b have a structure in which a plurality of semiconductor layers are stacked. The first and second light-emitting structures 100a and 100b may include the first conductivity-type semiconductor layers 110a and 110b, the active layers 120a and 120b, and the second conductivity-type semiconductor layers 130a and 130b that are sequentially stacked on the top surface of a substrate. For example, the first conductivity-type semiconductor layers 110a and 110b stacked on the substrate 101 may include a semiconductor doped with an n-type impurity and may be n-type nitride semiconductor layers. The second conductivity-type semiconductor layers 130a and 130b may include a semiconductor doped with a p-type impurity and may be p-type nitride semiconductor layers. In some cases, the first conductivity-type semiconductor layers 110a and 110b and the second conductivity-type semiconductor layers 130a and 130b may be stacked with their locations changed with each other. The first and second conductivity-type semiconductor layers 110a, 110b, 130a and 130b have a composition formula of $Al_xIn_yGa_{(1-x-y)}N$ (here, $0 \le X \le 1$, $0 \le Y \le 1$, $0 \le x+y \le 1$), e.g., GaN, AlGaN, InGaN, AlInGaN, etc.

The active layers 120a and 120b disposed between the first and second conductivity-type semiconductor layers 110a, 110b, 130a, and 130b emit light having particular (or, alternatively, predetermined) energy as electrons and holes recombine. The active layers 120a and 120b may include a material having an energy band gap smaller than the energy band gap of the first and second conductivity-type semiconductor layers 110a, 110b, 130a, and 130b. For example, when the first and second conductivity-type semiconductor layers 110a, 110b, 130a, and 130b include a GaN-based compound semiconductor, the active layers 120a and 120b include InGaN having an energy band gap smaller than the energy band gap of the GaN-based compound semiconductor. Furthermore, the active layers 120a and 120b may have a multiple quantum well (MQW) structure in which a quantum well layer and a quantum barrier layer are alternately stacked, e.g., an InGaN/GaN structure. However, the inventive concepts are not limited thereto, and the active layers 120a and 120b may have a single ("individual") quantum well structure (SQW).

The first and second light-emitting structures 100a and 100b may include the second conductivity-type semiconductor layers 130a and 130b, the active layers 120a and 120b, etched regions E (also referred to interchangeably herein as "etched structures") provided ("formed") based on partially etching one or more portions (e.g., forming one or more "etched portions") of the first conductivity-type semiconductor layers 110a and 110b, and a plurality of mesa regions M (also referred to interchangeably herein as "mesa structures") defined by the etched regions E.

The first light-emitting structure 100a may include an island-like structure (e.g., may include an island structure) when viewed from above. In some example embodiments, the first light-emitting structure 100a may have a single ("individual") island-like structure (e.g., an individual island structure). An island-like structure included in or constituting the first light-emitting structure 100a may include a rectangular structure or a rectangular structure having round corners C. The etched regions E of the first light-emitting structure 100a do not extend inwardly from the edges of the first light-emitting structure 100a when viewed from above. In some example embodiments, in order to limit and/or prevent current concentration at the corners C of the mesa regions M, the mesa may have a shape partially protruding outward adjacent to the corners C. In other words, a portion apart from the corner C may be recessed more than a portion adjacent to the corner C.

The etched regions E of the second light-emitting structure 100b may include fingers F (also referred to herein as "finger structures") that are structures provided as the second light-emitting structure 100b having a rectangular structure or a round rectangular structure is etched to a certain width and a certain length in a direction from a first side surface of the second light-emitting structure 100b to a second side surface facing the same. The fingers F may only be formed in the second light emitting structure 100b (e.g., may be restricted to the second light-emitting structure 100b). The fingers F may extend in the first direction (x direction). According to some example embodiments of the inventive concepts, the plurality of fingers F may be arranged in parallel to one another. For example, the etched region E disposed in the second light-emitting structure 100b may extend from one of four sides of the etched region E farthest from the first light-emitting structure 100a to a side closest to the first light-emitting structure 100a. For example, a finger F in the second light-emitting structure 100b may extend from an outer edge of the second light-emitting structure 100b towards an interior of the second light-emitting structure 100b. As shown in FIG. 2, a finger F may be at least partially defined by the etched region E (e.g., may "correspond" to the etched region E).

Here, the plurality of mesa regions M of the second light-emitting structure 100b are not completely separated by the fingers F, but may be connected to one another at other sides and may comprise a single ("individual") structure. In other words, the length of the finger F along the first direction (x direction) may be less than the length of the second light-emitting structure 100b along the first direction (x direction). However, the first and second light-emitting structures 100a and 100b are separated by an isolating region ISO and constitute separate LEDs.

Due to the formation of the etched regions E, the second light-emitting structure 100b may include a bridge region BR between any two island regions IR (e.g., between adjacent island structures) among the plurality of island regions IR ("island structures"). The bridge region BR may interconnect the two island regions IR adjacent to each other (e.g., adjacent island regions IR). As referred to herein, "island regions IR" may be referred to interchangeably as "island structures." In addition, a "bridge region BR" may be referred to interchangeably as a "bridge structure." A first edge of the bridge region BR and a plurality of first edges of the plurality of island regions IR may be collinear. Therefore, the second light-emitting structure 100b may be disposed as one LED without being separated. In some cases, the sum of the lengths of the bridge region BR and the plurality of island regions IR along the second direction may be substantially identical (e.g., identical within manufacturing tolerances and/or material tolerances) to the length of the first light-emitting structure 100a along the second direction. However, the inventive concepts is not limited thereto, and the sum of the lengths of the bridge region BR and the plurality of the island regions IR along the second direction may be different from the length of the first light-emitting structure 100a along the second direction. In this case, the first light-emitting structure 100a and the second light-emitting structure 100b may have different lengths along the second direction. To conclude, the first and second light-emitting structures 100a and 100b may include asymmetric structures or different structures.

The lower insulating patterns 210a and 210b are disposed on the side surface and the inclined surface of the mesa region M, that is, on the side inclined surface of the mesa region M so that the active layers 120a, 120b exposed by the etching region E on the mesa region M are covered by the lower insulating patterns 210a and 210b. The lower insulation patterns 210a and 210b may be disposed on the first and second light-emitting structures 100a and 100b and completely cover (e.g., cover an entirety of) the first and second light-emitting structures 100a and 100b.

Each of the lower insulation patterns 210a and 210b may include a material having insulation characteristics and may include an inorganic or organic material. Furthermore, the lower insulation patterns 210a and 210b may include a silicon oxide or a silicon nitride, e.g., $SiO_2$, SiN, $SiO_xN_y$, $TiO_2$, $Si_3N_4$, $Al_2O_3$, TiN, AlN, $ZrO_2$, TiAlN, etc.

The lower insulation patterns 210a and 210b may include a plurality of first openings that expose portions of top surfaces of the first conductivity-type semiconductor layers 110a and 110b exposed in the etched regions E and the second conductivity-type semiconductor layers 130a and 130b. Specifically, first openings 215 expose portions of the top surfaces of the second conductivity-type semiconductor layers 130a and 130b, such that the second conductivity-type semiconductor layers 130a and 130b are configured to be electrically connected to second contact electrodes 150a and 150b. As described below, since the first openings 215 are formed by a wet-etching operation, the lower insulation patterns 210a and 210b may be recessed and horizontally apart from the second contact electrodes 150a and 150b. However, the inventive concepts are not limited thereto, and the lower insulation patterns 210a and 210b may contact the second contact electrodes 150a and 150b due to a process error or scattering.

Here, the second contact electrodes 150a and 150b may be disposed on the portions of the second conductivity-type semiconductor layers 130a and 130b exposed by the first openings 215. The second contact electrodes 150a and 150b are configured to be electrically connected to the second conductivity-type semiconductor layers 130a and 130b.

The second contact electrodes 150a and 150b may include reflective electrode layers 151a and 151b. The reflective electrode layers 151a and 151b may be disposed to cover portions of the top surfaces of the second conductivity-type semiconductor layers 130a and 130b corresponding to the top surfaces of the mesa regions M. Each of the reflective electrode layers 151a and 151b may include at least one selected from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), an alloy thereof, or carbon (C). The first and second conductive layers 300a and 300b, the inter-structure conductive layer 300i, the first and second electrodes 500a and 500b, and first contact electrodes 140a and 140b described below may also include same materials. In particular, when the reflective electrode layers 151a and 151b include a material having high reflectivity, such as Al or Ag, the reflective electrode layers 151a and 151b function as a reflective layer, and thus light-emitting efficiency may be improved. Each of the reflective electrode layers 151a and 151b may include a multi-layer structure in which layers of different compositions are repeatedly stacked.

The second contact electrodes 150a and 150b may further include coating layers 152a and 152b covering the reflective electrode layers 151a and 151b. Although FIG. 3 shows that the coating layers 152a and 152b cover top surfaces and side surfaces of the reflective electrode layers 151a and 151b, the inventive concepts is not limited thereto. For example, the coating layers 152a and 152b may cover only (e.g., may be restricted to covering) the top surfaces of the reflective electrode layers 151a and 151b. Furthermore, the coating layers 152a and 152b may be selectively disposed and may be omitted in some cases. The coating layers 152a and 152b may include an insulating material in some cases. The coating layers 152a and 152b may include a conductive material or a semiconductor material in some cases.

Upper insulation patterns 220a and 220b are disposed above the first contact electrodes 140a and 140b, the second contact electrodes 150a and 150b, the lower insulation patterns 210a and 210b, the exposed first conductivity-type semiconductor layers 110a and 110b, and the exposed second conductivity-type semiconductor layers 130a and 130b. Furthermore, the upper insulation patterns 220a and 220b may cover the exposed first conductivity-type semiconductor layers 110a and 110b that are etched and exposed on the isolating region ISO. When the lower insulation patterns 210a and 210b are disposed apart from the second contact electrodes 150a and 150b, the upper insulation patterns 220a and 220b may include grooves 221 between the lower insulation patterns 210a and 210b and the second contact electrodes 150a and 150b. The upper insulation patterns 220a and 220b may have compositions substantially identical (e.g., identical within manufacturing tolerances and/or material tolerances) to those of the lower insulation patterns 210a and 210b.

The first insulation patterns 200a and 200b may be provided as integrated first insulation patterns 200a and 200b when the lower insulation patterns 210a and 210b and the upper insulation patterns 220a and 220b have the same composition. However, the inventive concepts are not limited thereto, and the lower insulation patterns 210a and 210b and the upper insulation patterns 220a and 220b may constitute two distinct layers when the lower insulation patterns 210a and 210b and the upper insulation patterns 220a and 220b have different compositions.

As shown in at least FIG. 2, the first insulation patterns 200a and 200b may cover at least a portion of the second contact electrodes 150a and 150b, least a portion of the first light-emitting structure 100a, and at least a portion of the second light-emitting structure 100b. In some example embodiments, the first insulation patterns 200a and 200b may be included in an integrated first insulation pattern.

The vertical thicknesses of the first insulation patterns 200a and 200b may vary. The first insulation patterns 200a and 200b apart from the second contact electrodes 150a and 150b (e.g., one or more separate portions of the first insulation patterns 200a and 200b that are on one or more particular portions of the second conductivity-type semiconductor layers 130a and/or 130b that are isolated from direct contact with the second contact electrodes 150a and 150b) may include portions having greater vertical thickness as compared to the first insulation patterns 200a and 200b disposed on the second contact electrodes 150a and 150b (e.g., one or more particular portions of the first insulation patterns 200a and 200b). The average of the vertical thicknesses of the first insulation patterns 200a and 200b disposed apart from the second contact electrodes 150a and 150b may be greater than the average of the vertical thicknesses of the first insulation patterns 200a and 200b disposed on the second contact electrodes 150a and 150b. The vertical thicknesses of the first insulation patterns 200a and 200b corresponding to the lower insulation patterns 210a and 210b may be greater than those of the first insulation patterns 200a and 200b corresponding to the second contact electrodes 150a and 150b. Furthermore, the vertical thicknesses of the first insulation patterns 200a and 200b disposed on the first conductivity-type semiconductor layers 110a and 110b on the etched regions E may be greater than the vertical thicknesses of the first insulation patterns 200a and 200b disposed on the second contact electrodes 150a and 150b. Here, the term 'vertical thickness' refers to a length along the third direction (z direction).

The upper insulation patterns 220a and 220b may include a plurality of second openings 225 exposing portions of the top surfaces of the second contact electrodes 150a and 150b and portions of the top surfaces of the first conductivity-type semiconductor layers 110a and 110b. The first contact electrodes 140a and 140b may be disposed on the portions of the top surfaces of the first conductivity-type semiconductor layers 110a and 110b exposed by the second openings 225. The first contact electrodes 140a and 140b may extend along the fingers F for uniform injection of electrons. However, the inventive concepts are not limited thereto, and the first contact electrodes 140a and 140b may be omitted in some cases. In this case, the second conductive layer 300b or the inter-structure conductive layer 300i, which will be described below, may be directly connected to the first conductivity-type semiconductor layers 110a and 110b.

The first contact electrodes 140a and 140b and the second contact electrodes 150a and 150b may be arranged to have a structure in which they are staggered from each other in order to increase the light-emitting efficiency of the first and second light-emitting structures 100a and 100b. However, the shapes and structures of the first and second contact electrodes 140a and 150b and the second contact electrodes 150a and 150b are merely examples and are not limited to those shown in the drawings.

The first and second conductive layers 300a and 300b and the inter-structure conductive layer 300i may be disposed above the upper insulation patterns 220a and 220b, the first contact electrodes 140a and 140b, and the exposed second contact electrodes 150a and 150b.

Each of the first and second conductive layers 300a and 300b and the inter-structure conductive layer 300i may be disposed apart from each other. Specifically, the first conductive layer 300a and the inter-structure conductive layer 300i may be disposed apart from each other across a second insulation pattern 400 therebetween. The second conductive layer 300b and the inter-structure conductive layer 300i may be disposed apart across the second insulation pattern 400 therebetween. In other words, each of the first and second conductive layers 300a and 300b and the inter-structure conductive layer 300i are disposed to not be electrically connected to each other directly. As described herein, elements that are described as being apart from each other, spaced apart from each other, or the like may be referred to as being isolated from direct contact with each other.

The first conductive layer 300a is configured to be electrically connected to the second contact electrode 150a disposed on the first light-emitting structure 100a. The second conductive layer 300b is configured to be electrically connected to the first contact electrode 140b disposed on the second light-emitting structure 100b. The inter-structure conductive layer 300i is disposed to electrically interconnect to the first contact electrodes 140a disposed on the first light-emitting structure 100a and the second contact electrode 150b disposed on the second light-emitting structure 100b. When the first contact electrodes 140a and 140b are omitted, the second conductive layer 300b may be configured to be electrically connected to the first conductivity-type semiconductor layer 110b of the second light-emitting structure 100b, whereas the inter-structure conductive layer 300i is configured to electrically interconnect the first conductivity-type semiconductor layer 110a disposed on the first light-emitting structure 100a and the second contact electrode 150b disposed on the second light-emitting structure 100b.

As a result, the first conductivity-type semiconductor layer 110a of the first light-emitting structure 100a and the second conductivity-type semiconductor layer 130b of the second light-emitting structure 100b are configured to be electrically connected to each other. Therefore, the first light-emitting structure 100a on the first cell region CELL1 corresponding to the first LED 13 (refer to FIG. 1) and the light-emitting structure 100b on the second cell region CELL2 corresponding to the second LED 14 (refer to FIG. 1) may be connected in series.

According to some example embodiments of the inventive concepts, the inter-structure conductive layer 300i covers the etched regions E, the isolating regions ISO, and the plurality of side surfaces of the light-emitting structure between the first cell region CELL1 and the second cell region CELL2, thereby limiting and/or preventing light leakage between cells. The term 'light leakage between cells' refers to a phenomenon that light-emitting efficiency is deteriorated as light leaks between the first cell region CELL1 and the second cell region CELL2, that is, the side surfaces of the first and second light-emitting structures 100a and 100b nearby the isolating region ISO.

In some cases, the inter-structure conductive layer 300i may cover all of inclined surfaces and flat surfaces of the etched regions E of the first and second light-emitting structures 100a and 100b and the exposed side surface of the isolating region ISO, thereby limiting and/or preventing internal light leakage. Particularly, when the inter-structure conductive layer 300i includes a material having high reflectivity, such as aluminum ("Al") or silver ("Ag"), the inter-structure conductive layer 300i may more effectively limit and/or prevent internal light leakage. In some cases, the inter-structure conductive layer 300i may cover all portions of the first and second light-emitting structures 100a and 100b exposed on the isolating region ISO to limit and/or prevent internal light leakage.

The length of the inter-structure conductive layer 300i along the second direction (y direction) may be substantially identical (e.g., identical within manufacturing tolerances and/or material tolerances) to the length of each of the first and second light-emitting structures 100a and 100b along the second direction (y direction). As a result, a cross-sectional area of the inter-structure conductive layer 300i through which a current may flow is also increased, and thus current leaning phenomenon may be limited and/or prevented and a resistance between the first light-emitting structure 100a and the second light-emitting structure 100b may be lowered. Therefore, light-emitting efficiency may be improved.

The second insulation pattern 400 is disposed on the first and second conductive layers 300a and 300b and the inter-structure conductive layer 300i and completely covers (e.g., covers an entirety of) and protects (e.g., isolates from exposure) the first and second conductive layers 300a and 300b and the inter-structure conductive layer 300i. The second insulation pattern 400 may have a composition substantially identical (e.g., identical within manufacturing tolerances and/or material tolerances) to that of the lower insulation pattern 210b described above. The second insulation pattern 400 may include third openings 405 that expose at least portions of the first and second conductive layers 300a and 300b and the inter-structure conductive layer 300i.

The plurality of third openings 405 may be formed in order to at least partially expose the top surfaces of the first conductive layer 300a on the first cell region CELL1 and the second conductive layer 300b on the second cell region CELL2. Although FIG. 3 shows that a total of three third openings 405 including one in the first cell region CELL1 and two in the second cell region CELL2 are formed and constitute an asymmetrical structure, the inventive concepts are not limited thereto. The number and arrangement of third openings 405 may vary.

The first and second electrodes 500a and 500b may be provided on the first and second conductive layers 300a and 300b partially exposed through the third openings 405, respectively. The first electrode 500a is configured to be electrically connected to the second conductivity-type semiconductor layer 130a on the first cell region CELL1 via the first conductive layer 300a and the second contact electrode 150a. The second electrode 500b is configured to be electrically connected to the first conductivity-type semiconductor layer 110b on the second cell region CELL2 via the second conductive layer 300b and the first contact electrode 140b. When the first contact electrode 140b is omitted, the second electrode 500b is configured to be electrically connected to the first conductivity-type semiconductor layer 110b on the second cell region CELL2 via the second conductive layer 300b.

The first electrode 500a and the second electrodes 500b may be, for example, under bump metallurgy (UBM) layers, and the number of each of the first electrode 500a and the second electrode 500b may be one or more. Although FIGS. 2 and 3 show that one first electrode 500a and two second electrodes 500b are provided, the inventive concepts is not limited thereto. The numbers and arrangements of the first electrode 500a and the second electrodes 500b may be adjusted according to the numbers and arrangements of the third openings 405. A groove for accommodating a conductive adhesive, e.g., Sn solder, may be disposed in each of the first and second electrodes 500a and 500b. The Sn solder is an external terminal and may correspond to the first external terminal 15 and the second external terminal 16 of FIG. 1.

FIG. 4, FIG. 5, FIG. 6, FIG. 7, FIG. 8, FIG. 9, FIG. 10, and FIG. 11 are cross-sectional views taken along the section line I-I' of FIG. 2 to describe a method of manufacturing a light-emitting device according to some example embodiments of the inventive concepts.

In FIG. 4, FIG. 5, FIG. 6, FIG. 7, FIG. 8, FIG. 9, FIG. 10, and FIG. 11, the reference numerals identical to those in FIGS. 2 and 3 denote the same members, and thus repeated descriptions thereof are omitted.

Figure 4:
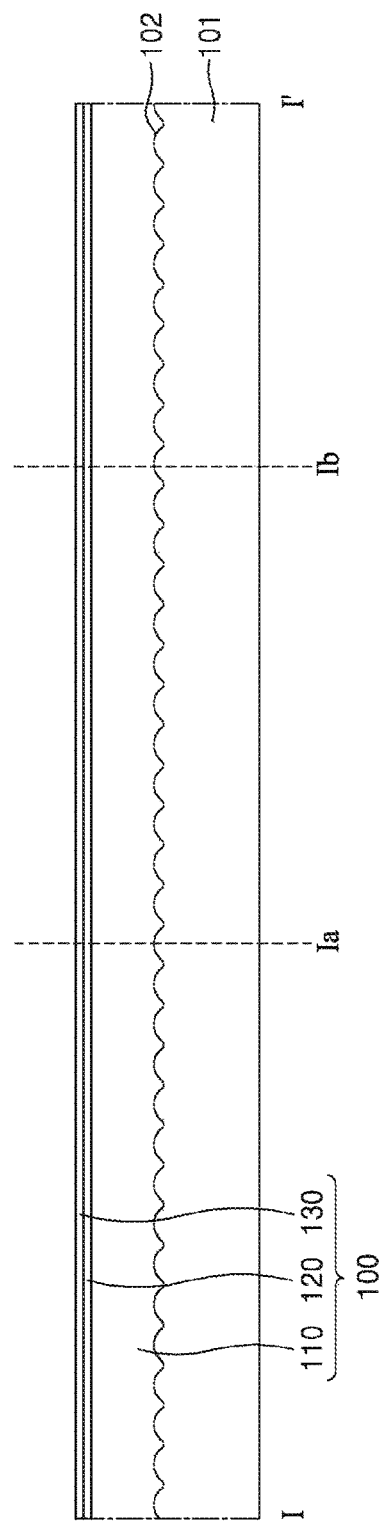
FIG. 4, FIG. 5, FIG. 6, FIG. 7, FIG. 8, FIG. 9, FIG. 10, and FIG. 11 are cross-sectional views for describing a method of manufacturing a light-emitting device according to some example embodiments of the inventive concepts.

First, referring to FIG. 4, the concavo-convex structure 102 may be disposed on the substrate 101. However, in some cases, the concavo-convex structure 102 may be omitted. As described above, a substrate including a material, such as sapphire, Si, SiC, $MgAl_2O_4$, MgO, $LiAlO_2$, $LiGaO_2$, or GaN, may be used as the substrate 101. Although not shown, a buffer layer may be optionally provided on the substrate 101. The buffer layer may include undoped GaN, AlN, InGaN, etc.

Next, using a method like MOCVD, hydride vapor phase epitaxy (HYPE), or molecular beam epitaxy (MBE), a light-emitting structure precursor 100, in which a plurality of semiconductor layers are stacked, is disposed by growing a first conductivity-type semiconductor material layer 110, an active material layer 120, and a second conductivity-type semiconductor material layer 130 on the substrate 101 in the order stated. Here, the first conductivity-type semiconductor material layer 110 and the second conductivity-type semiconductor material layer 130 may be an n-type semiconductor layer and a p-type semiconductor layer, respectively. The locations of the first conductivity-type semiconductor material layer 110 and the second conductivity-type semiconductor material layer 130 in the first and second light-emitting structures 100b may be reversed, and the second conductivity-type semiconductor material layer 130 may be disposed on the substrate 101 first.

Figure 5:
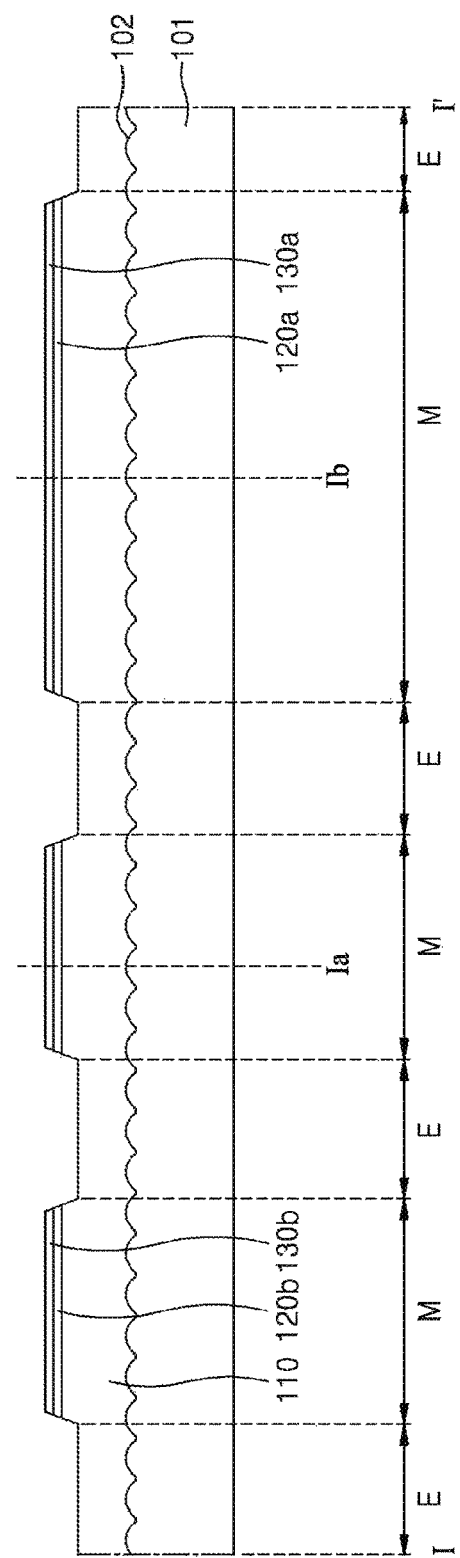

Referring to FIG. 5, portions of the second conductivity-type semiconductor material layer 130 (refer to FIG. 4), the active material layer 120 (refer to FIG. 4), and the first conductivity-type semiconductor material layer 110 may be etched to expose at least a portion of the first conductivity-type semiconductor material layer 110.

After a photomask pattern is provided on the light-emitting structure precursor 100, portions of the second conductivity-type semiconductor material layer 130 (refer to FIG. 4), the active material layer 120 (refer to FIG. 4), and the first conductivity-type semiconductor material layer 110 may be wet-etched or dry-etched, thereby forming the etched regions E and the plurality of mesa regions M defined by the etched regions E. Therefore, the second conductivity-type semiconductor material layer 130 and the active material layer 120 may each be separated into two and may provide the second conductivity-type semiconductor layers 130a and 130b and the active layers 120a and 120b, respectively. In some cases, the first conductivity-type semiconductor material layer 110 may not be etched and an etching operation may be performed to expose only a portion of the top surface of the first conductivity-type semiconductor material layer 110. In some cases, the first conductivity-type semiconductor material layer 110 may be etched to a certain depth by excessive etching.

Figure 6:
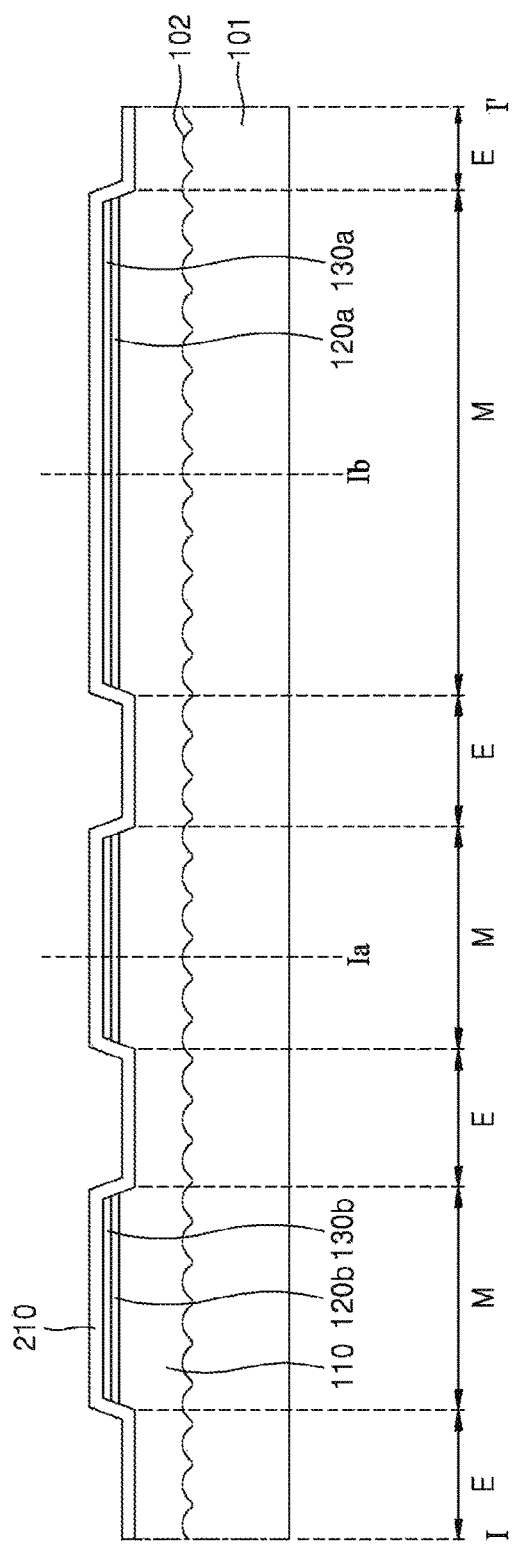

Referring to FIG. 6, a lower insulation layer 210 may be conformally disposed on the mesa regions M and the etched regions E. The lower insulation layer 210 may have a structure that covers at least some of edges of the top surfaces of the mesa regions M and at least some of the bottom surfaces of the etched regions E and the side surfaces of the mesa regions M. Therefore, the active layers 120a and 120b exposed during formation of the mesa regions M may be covered by the lower insulation layer 210 and not externally exposed. Furthermore, a lower insulation layer 210 may include silicon oxide or silicon nitride. For example, the lower insulation layer 210 may include $SiO_2$, SiN, $SiO_xN_y$, $TiO_2$, $Si_3N_4$, $Al_2O_3$, TiN, AlN, $ZrO_2$, TiAlN, TiSiN, etc.

Figure 7:
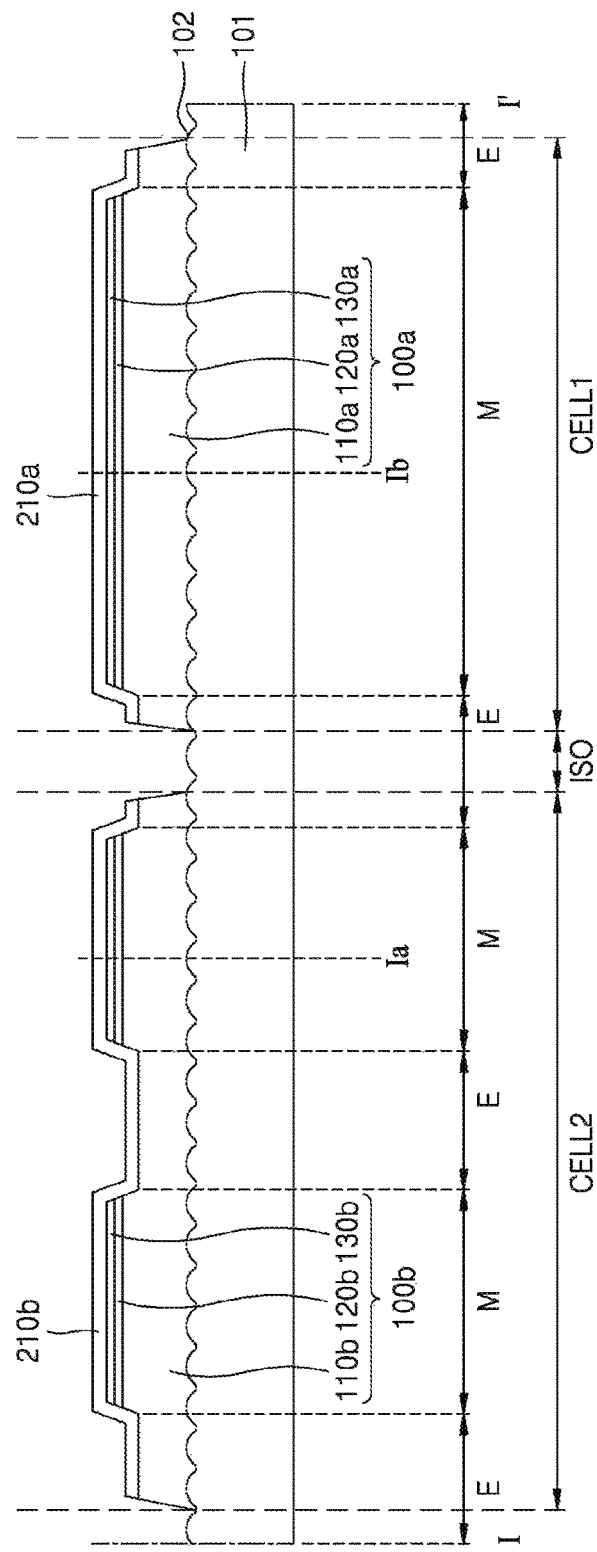

Referring to FIG. 7, the light-emitting structure precursor 100 is separated, thereby defining the first cell region CELL1, the second cell region CELL2, and the isolating region ISO.

After a photomask pattern is provided on the light-emitting structure precursor 100, the first conductivity-type semiconductor material layer 110 may be etched so that the top surface of the substrate 101 is exposed. As a result, the first conductivity-type semiconductor material layer 110 (refer to FIG. 6) is separated, and the first cell region CELL1, the second cell region CELL2, and the isolating region ISO are defined.

At this time, the lower insulation layer 210 may limit and/or prevent contamination of the side surfaces of the mesa regions R and the top surfaces of the second conductivity-type semiconductor layers 130a and 130b by materials scattered from the first conductivity-type semiconductor material layer 110 during a separating operation. Therefore, a light-emitting device having improved reliability may be provided.

Figure 8:
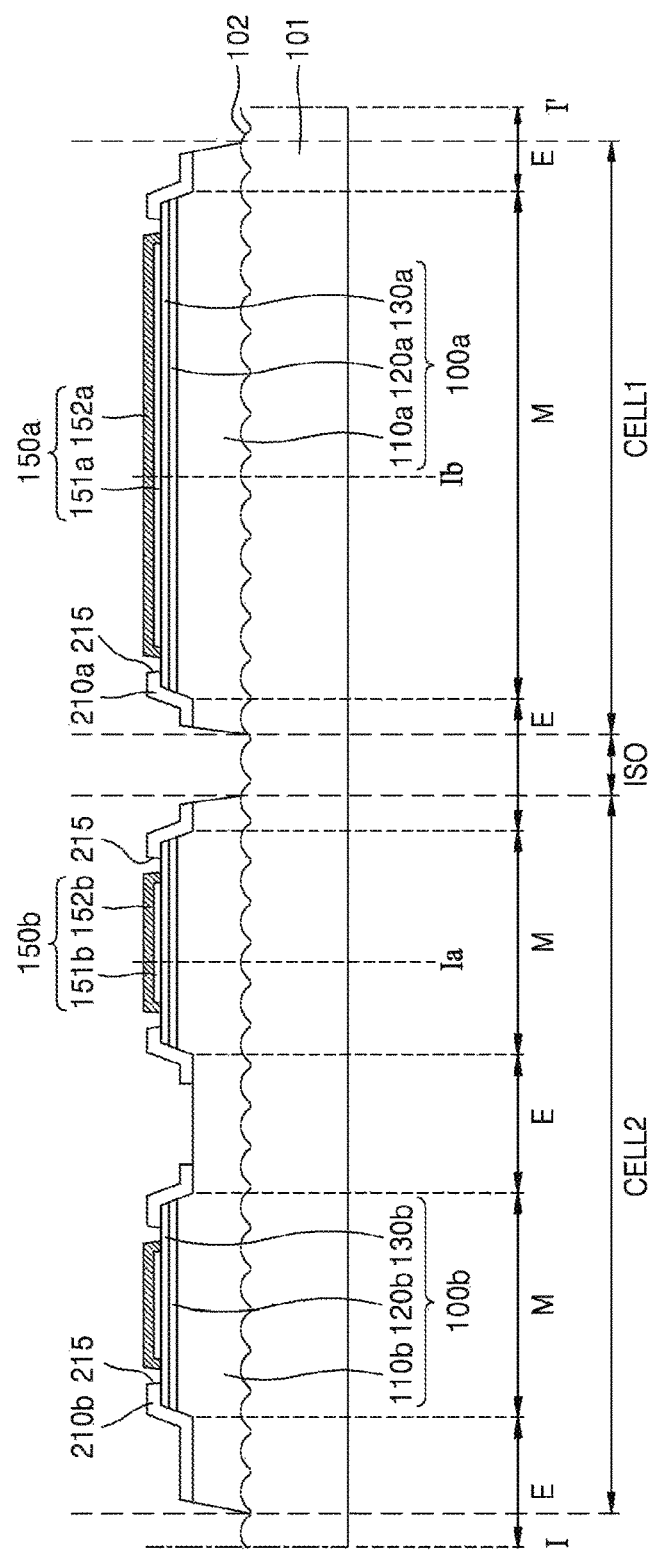

Referring to FIG. 8, the first openings 215 and the second contact electrodes 150a and 150b may be disposed on the second conductivity-type semiconductor layers 130a and 130b on the mesa regions M.

A photomask pattern is provided on the first and second light-emitting structures 100a and 100b and the substrate 101 in order to define the first openings 215 for providing the second contact electrodes 150a and 150b. Next, a portion of the lower insulation layer 210 is removed by an etching process, thereby forming the lower insulation patterns 210a and 210b including the first openings 215. When exposed portions of the lower insulation layer 210 are removed by a wet-etching process, the lower insulation layer 210 may be recessed further in the horizontal direction as compared to regions of the lower insulation layer 210 exposed by the photomask pattern. Portions of the top surfaces of the second conductivity-type semiconductor layers 130a and 130b are exposed by the first openings 215.

A reflective electrode-providing layer and a coating-providing layer may be sequentially provided over the first openings 215 and the photomask pattern. Next, the photomask pattern is removed by an ashing operation or a lift-off operation. Therefore, the reflective electrode-providing layer disposed on the photomask pattern and the coating-providing layer covering the reflective electrode-providing layer are removed, and the second contact electrodes 150a and 150b including the reflective electrode layers 151a and 151b and the coating layers 152a and 152b are disposed. As described above, since the first openings 215 are recessed, the second contact electrodes 150a and 150b may be horizontally apart from the lower insulation patterns 210a and 210b. However, the inventive concepts are not limited thereto, and the lower insulating pattern and the second contact electrodes 150a and 150b may contact each other due to a process error.

Although FIG. 8 shows that the coating layers 152a and 152b cover the top surfaces and the side surfaces of the reflective electrode layers 151a and 151b, the inventive concepts is not limited thereto. For example, the coating layers 152a and 152b may cover only the top surfaces of the reflective electrode layers 151a and 151b. Furthermore, each of the second contact electrodes 150a and 150b may also have a multilayer structure including two or more reflective electrode layers and/or two or more coating layers.

Figure 9:
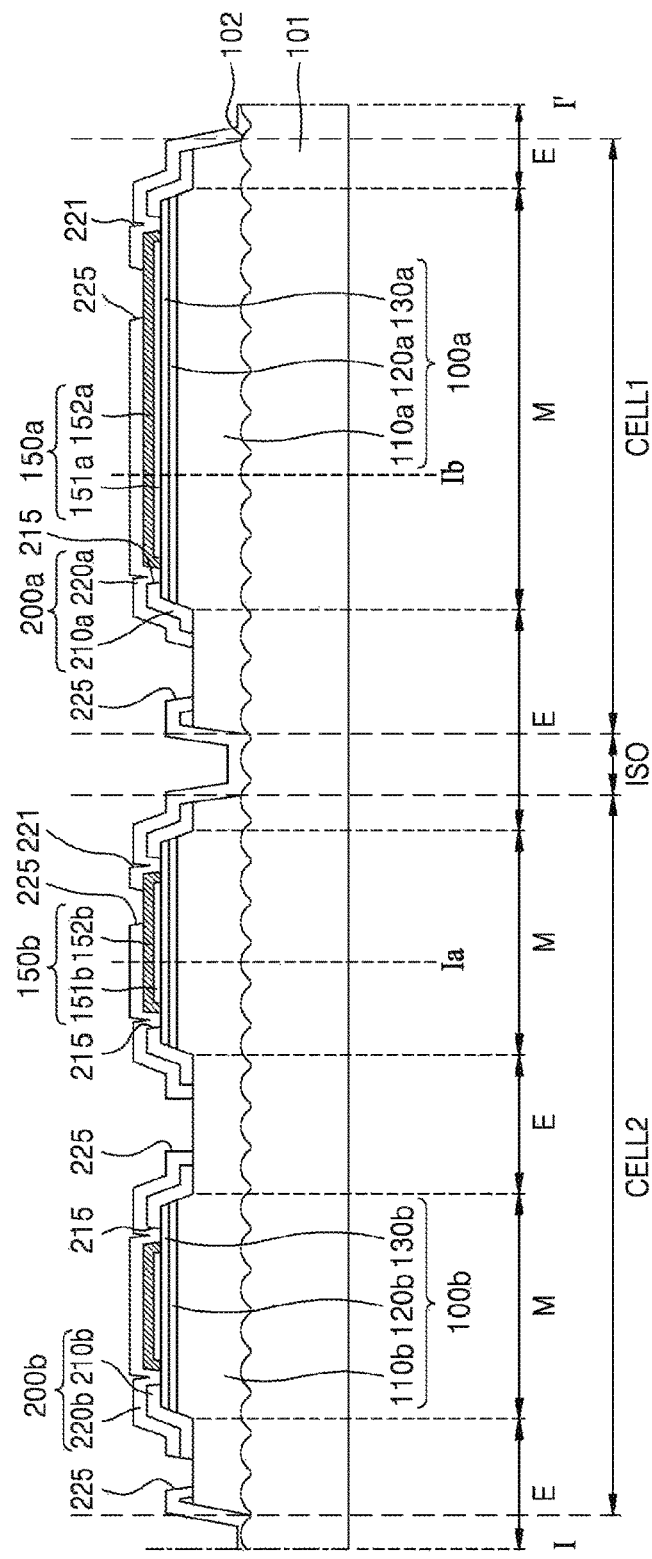

Referring to FIG. 9, the upper insulation patterns 220a and 220b including the second openings 225 may be disposed. The upper insulation patterns 220a and 220b may be disposed by conformally providing an upper insulation layer and patterning the upper insulation layer. The upper insulation layer may have a composition identical to that of the lower insulation layer 210 (refer to FIG. 6). Portions of the top surfaces of the second contact electrodes 150a and 150b may be exposed by the second openings 225.

The upper insulation patterns 220a and 220b and the lower insulation patterns 210a and 210b may be integrated with one another to constitute the first insulation pattern 200a. In some example embodiments, the upper insulation patterns 220a and 220b and the lower insulation pattern 210a and 210b may constitute separate layers distinguished from each other, respectively. As described above, since the second contact electrodes 150a and 150b are horizontally apart from the lower insulation patterns 210a and 210b, the upper insulation patterns 220a and 220b disposed between the second contact electrodes 150a and 150b and the lower insulation patterns 210a and 210b may include grooves 221.

Figure 10:
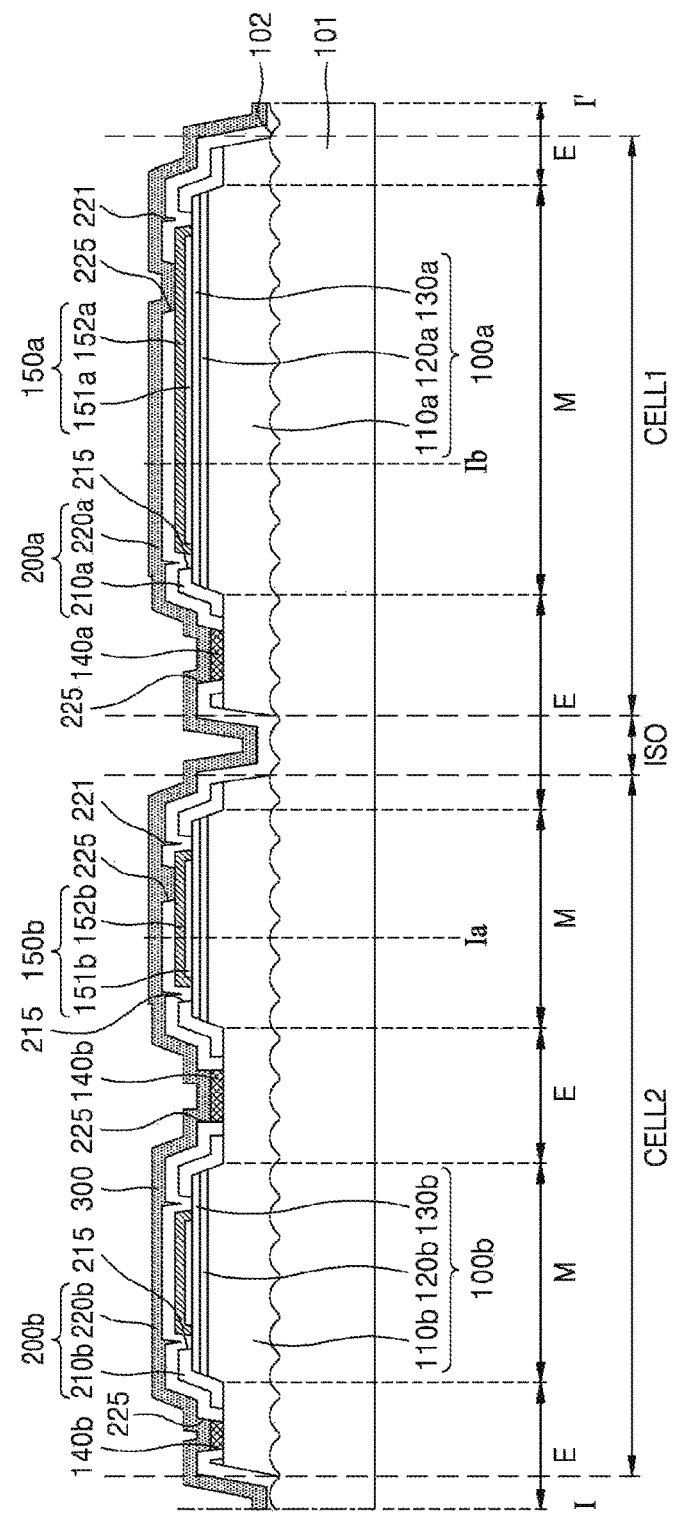

Referring to FIG. 10, the first contact electrodes 140a and 140b and a conductive layer 300 may be provided.

The first contact electrodes 140a and 140b may be provided on the etched regions E exposed by the second openings 225, that is, the exposed top surfaces of the first conductivity-type semiconductor layers 110a and 110b. The first contact electrodes 140a and 140b are configured to be electrically connected to the first conductivity-type semiconductor layers 110a and 110b, which define the etched regions E, along the etched regions E. In some cases, the first contact electrodes 140a and 140b may be omitted.

Next, the conductive layer 300 may be conformally provided over the upper insulation patterns 220a and 220b, the first contact electrodes 140a and 140b, and the exposed second contact electrodes 150a and 150b. When the first contact electrodes 140a and 140b are omitted, the conductive layer 300 may be configured to be directly and electrically connected to the first conductivity-type semiconductor layers 110a and 110b.

Figure 11:
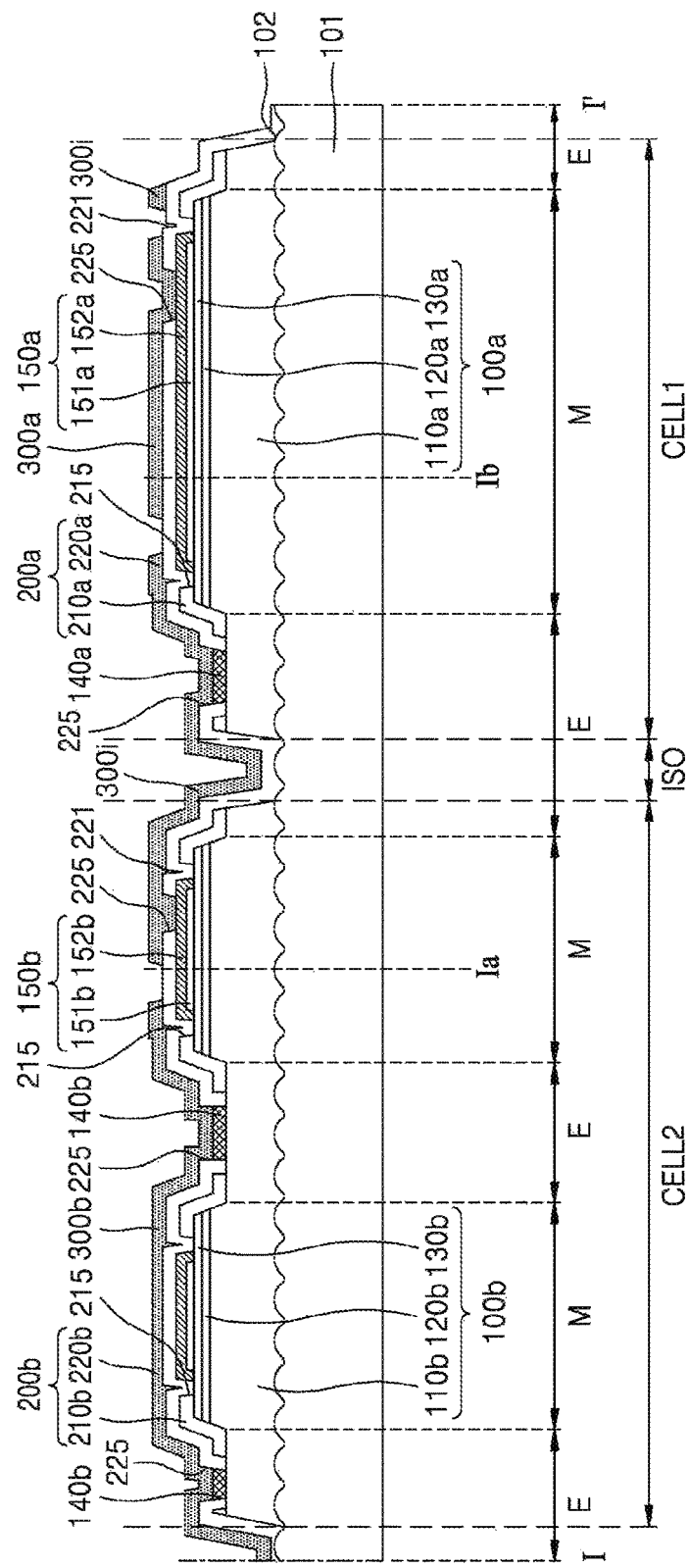

Referring to FIG. 11, the conductive layer 300 (refer to FIG. 10) may be etched, and thus the first conductive layer 300a, the second conductive layer 300b, and the inter-structure conductive layer 300i may be disposed. After disposing a mask pattern on the conductive layer 300 (refer to FIG. 10), the conductive layer 300 is separated via an etching process, thereby defining first and second conductive layers 300a and 300b and the inter-structure conductive layer 300i.

The second conductive layer 300b may be horizontally apart from the second openings 225 disposed on the second conductivity-type semiconductor layer 130b of the second cell region CELL2. The second conductive layer 300b may overlap the second openings 225 formed on the first conductivity-type semiconductor layer 110b of the second cell region CELL2 when viewed from above.

The inter-structure conductive layer 300i may overlap the second openings 225 formed on the second conductivity-type semiconductor layer 130b of the second cell region CELL2 when viewed from above. The inter-structure conductive layer 300i may overlap the second openings 225 formed on the first conductivity-type semiconductor layer 110a of the first cell region CELL1 when viewed from above.

Referring back to FIG. 2, the first conductive layer 300a may be an island-like structure surrounded by the inter-structure conductive layer 300i. The first conductive layer 300a may be horizontally apart from the second openings 225 formed on the first conductivity-type semiconductor layer 110a of the first cell region CELL1. The first conductive layer 300a may overlap the second openings 225 formed on the second conductivity-type semiconductor layer 130b of the first cell region CELL1 when viewed from above.

Etching the conductive layer 300 corresponds to a node separating operation, where the first conductive layer 300a is configured to be directly and electrically connected to the second conductivity-type semiconductor layer 130a of the first cell region CELL1 and not to be directly and electrically connected to the first conductivity-type semiconductor layer 110a of the first cell region CELL1 and the first and second conductivity-type semiconductor layers 110b and 130b of the second cell region CELL2. The second conductive layer 300b is configured to be directly and electrically connected to the first conductivity-type semiconductor layer 110b of the second cell region CELL2 and not to be directly and electrically connected to the first and second conductivity-type semiconductor layers 110a and 130a of the first cell region CELL1 and the second conductivity-type semiconductor layer 130b of the second cell region CELL2. Furthermore, the inter-structure conductive layer 300i is configured to be directly and electrically connected to the first conductivity-type semiconductor layer 110a of the first cell region CELL1 and the second conductivity-type semiconductor layer 130b of the second cell region CELL2 and not to be directly and electrically connected to the second conductivity-type semiconductor layer 130a of the first cell region CELL1 and the first conductivity-type semiconductor layer 110b of the second cell region CELL2.

Referring again to FIG. 3, a second insulation pattern (not shown), the first electrode 500a, and the second electrode 500b may be formed.

The second insulation layer is conformally provided over the first and second conductive layers 300a and 300b, the inter-structure conductive layer 300i, and the first insulation patterns 200a and 200b exposed therebetween. The second insulating layer may have a composition identical to that of the lower insulation layer 200 (refer to FIG. 6). Therefore, the second insulating layer may be between the first conductive layer 300a and the inter-structure conductive layer 300i and between the second conductive layer 300b and the inter-structure conductive layer 300i.

Next, a mask pattern exposing at least a portion of the second insulating film disposed on the first and second conductive layers 300a and 300b is disposed. Next, the second insulation pattern 400 and the first and second electrodes 500a and 500b may be disposed in a manner substantially identical (e.g., identical within manufacturing tolerances and/or material tolerances) to that in which the second contact electrodes 150a and 150b are disposed in FIG. 8.

As a result, the second insulation pattern 400 including the plurality of third openings 405 may be provided. The first conductive layer 300a and the inter-structure conductive layer 300i are disposed apart from each other across the second insulation pattern 400 therebetween. The second conductive layer 300b and the inter-structure conductive layer 300i are disposed apart from each other across the second insulation pattern 400 therebetween. The third openings 405 expose at least portions of the first and second conductive layers 300a and 300b.

The first electrode 500a and the second electrodes 500b may be disposed on the portions of the first and second conductive layers 300a and 300b exposed by the third openings 405, respectively. The first and second electrodes 500a and 500b may be, for example, under bump metallurgy (UBM) layers. The first electrode 500a may be disposed on the mesa region M of the first cell region CELL1, whereas the second electrodes 500b may be disposed on the mesa region M of the second cell region CELL2.

The second insulation pattern 400 may also be recessed via a wet-etching as described above regarding the formation of the lower insulation pattern with reference to FIG. 8. Therefore, the first and second electrodes 500a and 500b may be horizontally apart from the second insulation pattern 400. However, the inventive concepts is not limited thereto and, due to a process error, the first and second electrodes 500a and 500b may contact the second insulation pattern 400.

Figure 12:
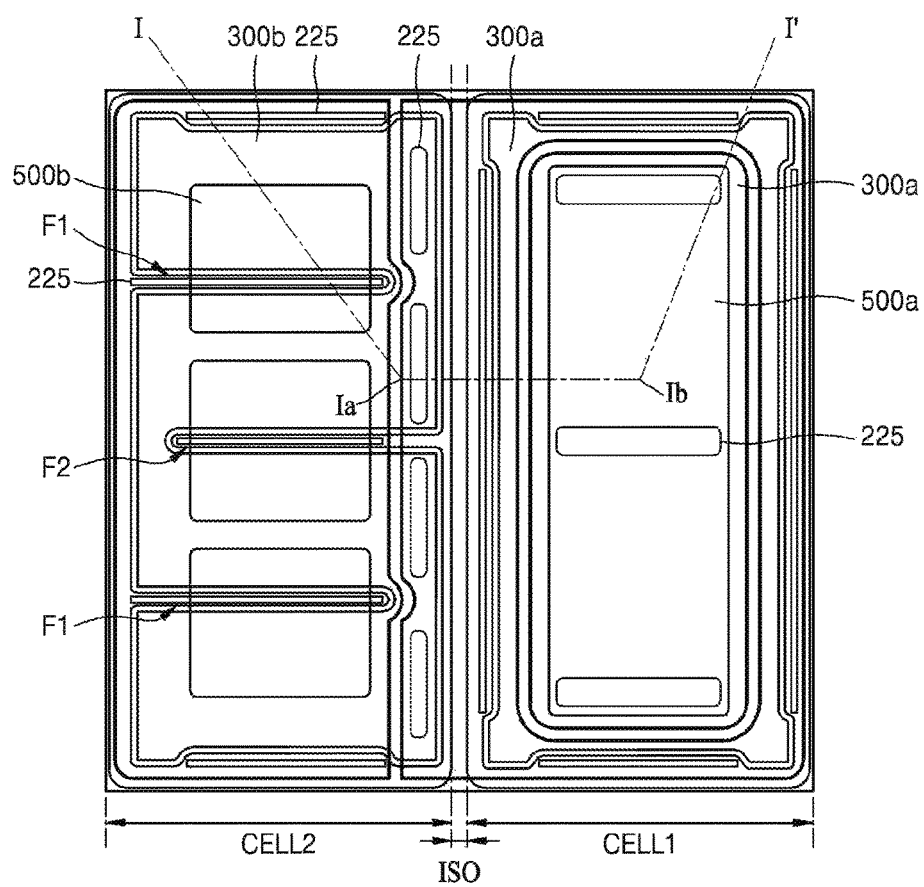
FIG. 12 is a layout diagram schematically showing a light-emitting device according to some example embodiments of the inventive concepts.

FIG. 12 is a layout diagram schematically showing a light-emitting device 20 according to some example embodiments of the inventive concepts. Hereinafter, for convenience of explanation, repeated descriptions are omitted and descriptions below will focus on differences from those described above with reference to FIGS. 2 and 3.

Referring to FIG. 3 and FIG. 12, the first light-emitting structure 100a may be disposed on the first cell region CELL1. The first light-emitting structure 100a may have an island-like structure with a rectangular or round rectangular shape when viewed from above. The etched regions E of the first light-emitting structure 100a do not extend inwardly from edges of the first light-emitting structure 100a.

The second light-emitting structure 100b may be disposed on the second cell region CELL2. The etched regions E of the second light-emitting structure 100b may include first and second fingers F1 and F2, which are structures formed as portions of the second light-emitting structure 100b are etched to a certain thickness and a certain length from the outer edges of the second light-emitting structure 100b toward the interior of the second light-emitting structure 100b. The first finger F1 may extend from a first side toward a second side facing the first side. Specifically, the first finger F1 may extend along the first direction (x direction) from the edge farthest from the first light-emitting structure 100a. The second finger F2 may extend from the second side toward the first side facing the second side. Specifically, the second finger F2 may extend along the first direction (x direction) from the edge farthest from the first light-emitting structure 100a. Although FIG. 12 shows that the first finger F1 and the second finger F2 are alternately arranged to be staggered, the inventive concepts are not limited thereto. The second opening 225 corresponding to the second finger F2 may be shorter than the second opening 225 corresponding to the first finger F1 to limit and/or prevent short circuit to the inter-structure conductive layer 300i.

Figure 13A:
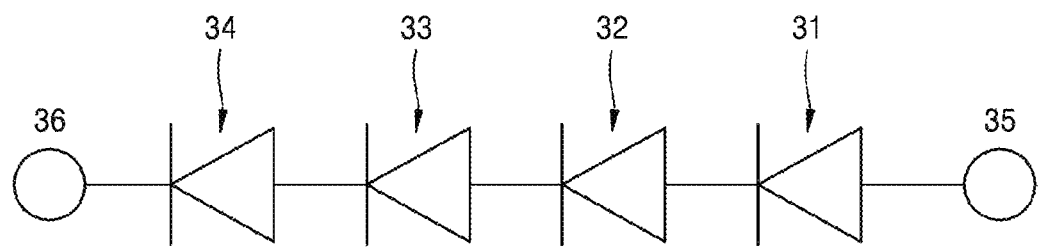
FIG. 13A is a schematic circuit diagram of a light-emitting device according to some example embodiments of the inventive concepts.

FIG. 13A is a schematic circuit diagram of a light-emitting device 30 according to some example embodiments of the inventive concepts. FIG. 13B is a layout diagram of the light-emitting device 30 of FIG. 13A. Hereinafter, for convenience of explanation, repeated descriptions are omitted and descriptions below will focus on differences from those described above with reference to FIGS. 2 and 3.

Referring to FIG. 13A, the light-emitting device 30 may include first through fourth LEDs 31, 32, 33, and 34. The first through fourth LEDs 31, 32, 33, and 34 correspond to first through fourth cell regions CELL1, CELL2, CELL3, and CELL4, respectively. The first through fourth LEDs 31, 32, 33, 34 may be connected in series between first and second external terminals 35, 36. The P node of the first LED 31 may be electrically connected to the first external terminal 35. The N node of the fourth LED 34 may be electrically connected to the second external terminal 36. The N-node of the first LED 31 may be connected to the P-node of the second LED 32. The N-node of the second LED 32 may be connected to the P-node of the third LED 33. The N-node of the third LED 33 may be connected to the P-node of the fourth LED 34. Therefore, there are four active layers between two external terminals. Generally, when a voltage drop due to one LED is denoted by Vd, since four LEDs are connected in series in the light-emitting device 30 of FIG. 13, a voltage drop of 4Vd occurs.

Furthermore, in a light-emitting device in which n LEDs are connected in series in the above-stated manner, the n LEDs may be connected in series in a manner that the P-node of a first LED and the N-node of an $n^{th}$ node are connected to external terminals and the N-node of a $(k-1)^{th}$ LED is connected to the P-node of a $k^{th}$ LED.

Referring to FIG. 13B, first through fourth light-emitting structures 100a, 100b, 100c, and 100d may be sequentially provided in the first through fourth cell regions CELL1, CELL2, CELL3, and CELL4, respectively. Since the first electrode 500a is not formed in the second and third light-emitting structures 100b and 100c, one or more fingers F may be disposed in the second and third light-emitting structures 100b and 100c. Here, although FIG. 13B shows that two fingers F are disposed in each of the second and third light-emitting structures 100b and 100c, the inventive concepts are not limited thereto. For example, the finger F may not be disposed in the second and third light-emitting structures 100b and 100c. In some example embodiments, different numbers of fingers F may be disposed in the second and third light-emitting structures 100b and 100c. In other words, the shapes of the first through fourth light-emitting structures 100a, 100b, 100c, and 100d may be different from one another. In other words, the shapes of the light-emitting structures connected in series may vary to have suitable structures according to some example embodiments.

In some cases, the first through fourth cell regions CELL1, CELL2, CELL3, and CELL4 may further include open regions that expose at least portions of the first conductive layer 300a, the second conductive layer 300b, and the inter-structure conductive layer 300i. Such an open region is configured to be electrically connected to an external probe in order to check whether a light-emitting device normally operates before the light-emitting device is mounted.

Figure 14A:
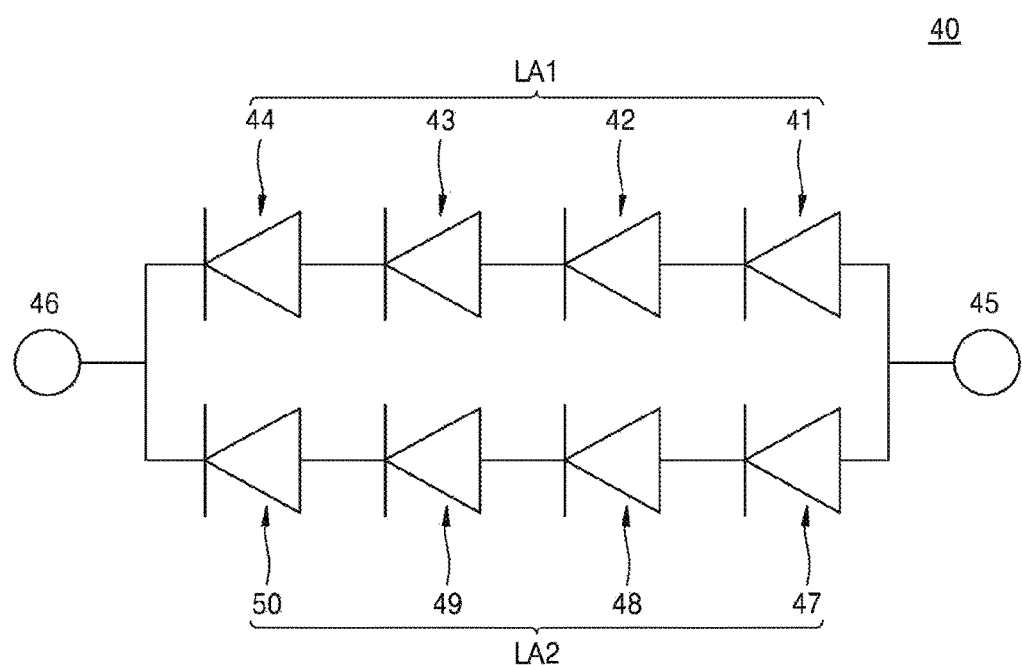
FIG. 14A is a schematic circuit diagram of a light-emitting device according to some example embodiments of the inventive concepts.
Figure 14B:
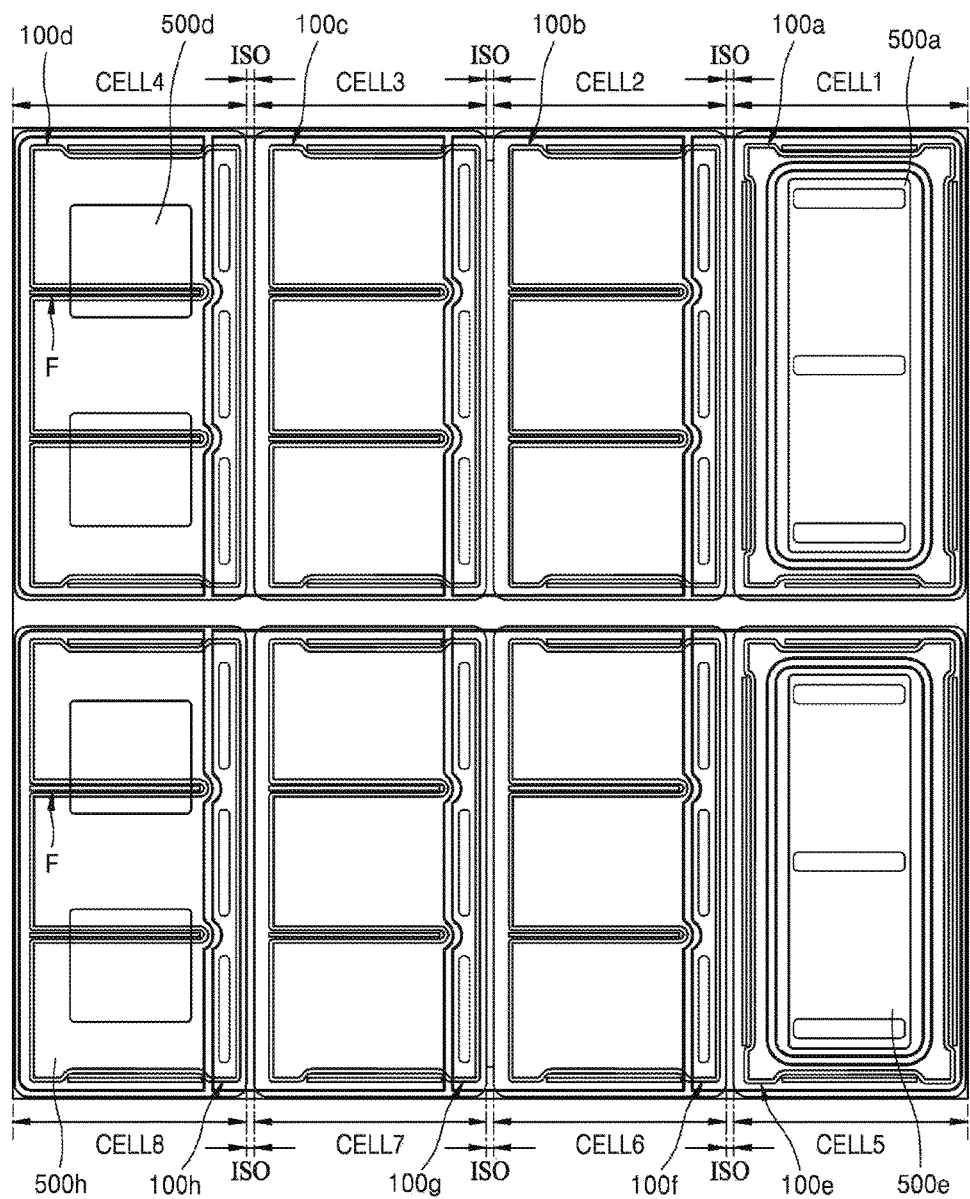
FIG. 14B is a layout diagram of the light-emitting device of FIG. 14A.

FIG. 14A is a schematic circuit diagram of a light-emitting device 40 according to some example embodiments of the inventive concepts. FIG. 14B is a layout diagram of the light-emitting device 40 of FIG. 14A. Hereinafter, for convenience of explanation, repeated descriptions are omitted and descriptions below will focus on differences from those described above with reference to FIGS. 2 and 3 or FIGS. 13A and 13B.

Referring to FIGS. 14A and 14B, the light-emitting device 40 may include first through eighth LEDs 41, 42, 43, 44, 47, 48, 49, and 50. The first through eighth LEDs 41, 42, 43, 44, 47, 48, 49, and 50 correspond to first through eighth cell regions CELL1, CELL2, CELL3, CELL4, CELL5, CELL6, CELL7, and CELL8 in the order stated.

The first through fourth LEDs are connected in series and constitute a first LED array LA1 and the fifth to eighth LEDs are connected in series and constitute a second LED array LA2. The first LED array LA1 and the second LED array LA2 may be connected in parallel. The P nodes of the first LED 41 and the fifth LED 47 may be connected to the first terminal 45 and the N nodes of the fourth LED 44 and the eighth LED 50 may be connected to the second terminal 46. Although FIGS. 14A and 14B show that the light-emitting device 40 includes two LED arrays connected in parallel, the connection may be applied to a parallel connection of three or more LED arrays.

Referring to FIG. 14B, the first electrode 500a and a fifth electrode 500e are disposed apart from each other, and a fourth electrode 500d and an eighth electrode 500h are formed apart from each other. However, the inventive concepts are not limited thereto. For example, the first electrode 500a and the fifth electrode 500e may be integrated with each other, and the fourth electrode 500d and the eighth electrode 500h may be integrated with each other.

Although FIG. 14B shows that each of the second cell region CELL2, the third cell region CELL3, the sixth cell region CELL6, and the seventh cell region CELL7 includes the two fingers F. the inventive concepts are not limited thereto. Each of the first LED array LA1 and the second LED array LA2 may have an asymmetric structure. The first LED array LA1 and the second LED array LA2 may have different structures.

Figure 15:
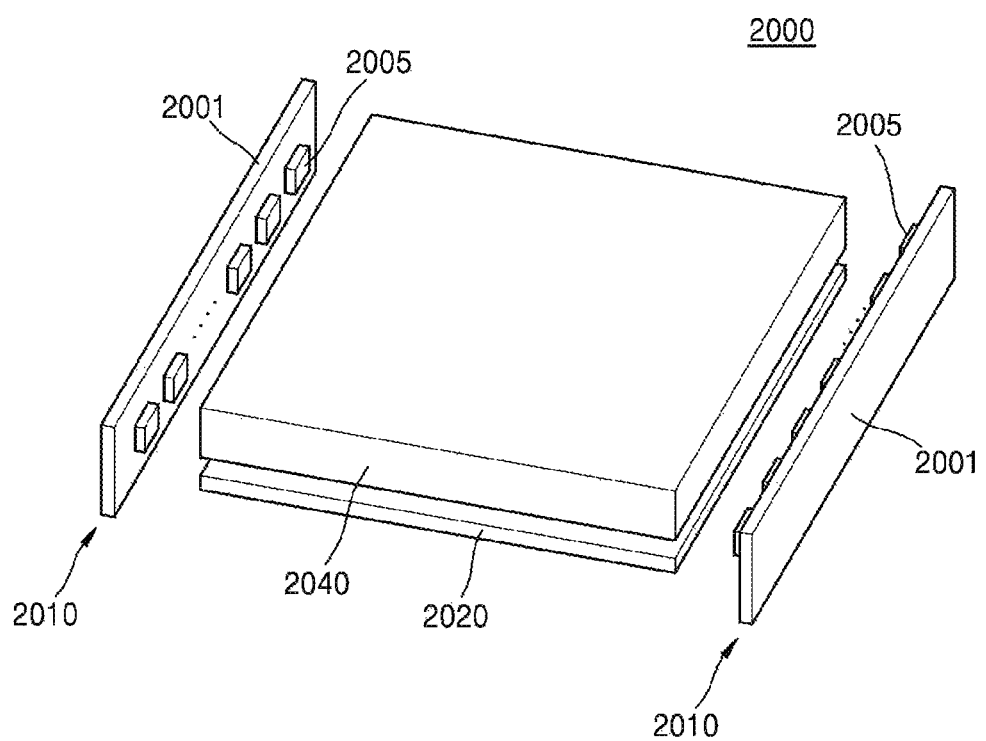
FIG. 15 is a schematic perspective view of a backlight unit including a light-emitting device according to some example embodiments of the inventive concepts.

FIG. 15 is a schematic perspective view of a backlight unit including a light-emitting device according to some example embodiments of the inventive concepts.

Specifically, a backlight unit 2000 may include a waveguide 2040 and light source modules 2010 provided on both sides of the waveguide 2040. The backlight unit 2000 may further include a reflective plate 2020 disposed below the waveguide 2040. The backlight unit 2000 according to some example embodiments may be an edge-type backlight unit. According to some example embodiments, the light source module 2010 may be provided only on one side of the waveguide 2040 or additional light source modules 2010 may be provided on other sides. The light source module 2010 may include a printed circuit board 2001 and a plurality of light sources 2005 mounted on the top surface of the printed circuit board 2001. The light source 2005 may be a light-emitting device 10, 20, 30, or 40 according to the above embodiments (Refer to FIGS. 1, 13A, and 14A).

Figure 16:
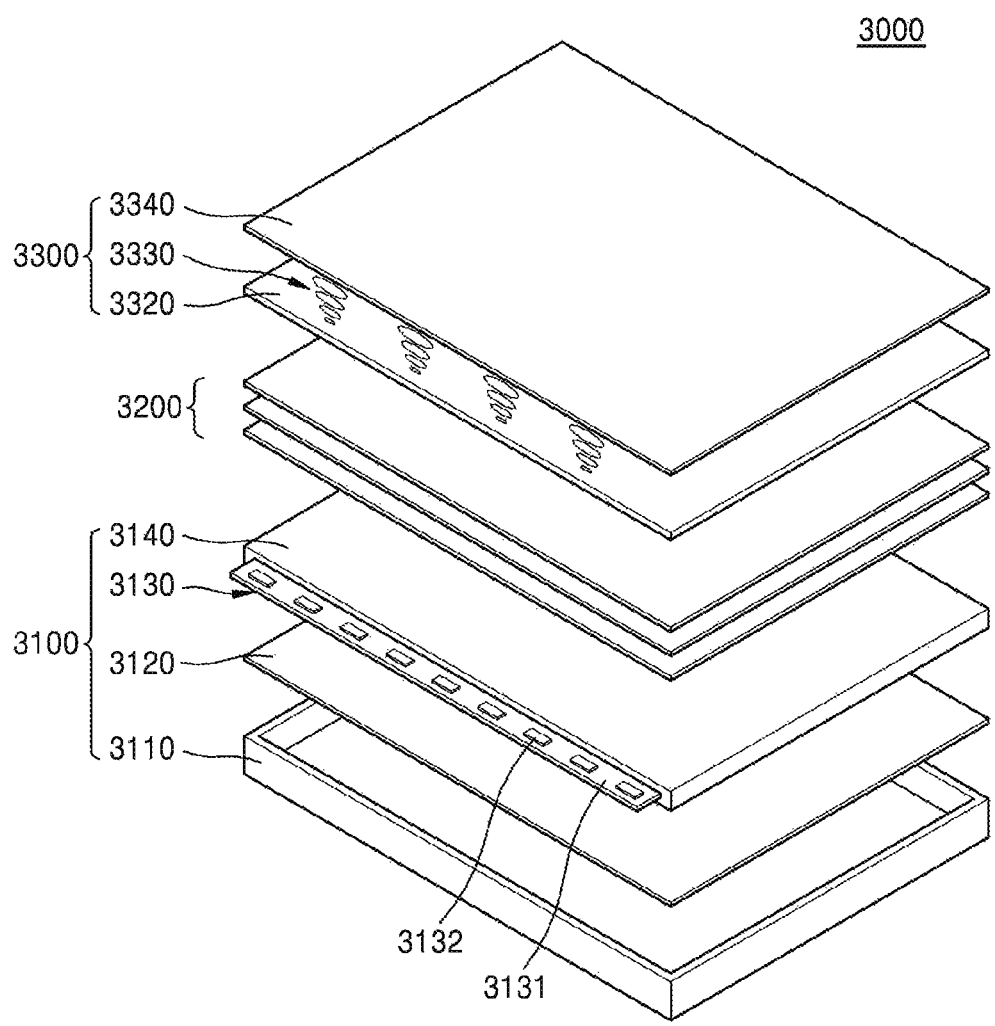
FIG. 16 is a schematic exploded perspective view of a display apparatus including a light-emitting device according to some example embodiments of the inventive concepts.

FIG. 16 is a schematic exploded perspective view of a display apparatus including a light-emitting device according to some example embodiments of the inventive concepts.

Specifically, a display apparatus 3000 may include a backlight unit 3100, an optical sheet 3200, and an image display panel 3300, such as a liquid crystal panel. The backlight unit 3100 may include a bottom case 3110, a reflective plate 3120, a waveguide 3140, and a light source module 3130 provided on at least one side of the bottom case 3110. The light source module 3130 may include a printed circuit board 3131 and a light source 3132.

In particular, the light source 3132 may be a side-view type light-emitting device mounted on a side surface adjacent a light-emitting surface. The light source 3132 may be a light-emitting device 10, 20, 30, or 40 according to the above embodiments (Refer to FIGS. 1, 13A, and 14A). The optical sheet 3200 may include various types of sheets, such as a sheet, a prism sheet, or a protective sheet.

The image display panel 3300 may display an image by using light emitted from the optical sheet 3200. The image display panel 3300 may include an array substrate 3320, a liquid crystal layer 3330, and a color filter substrate 3340. The array substrate 3320 may include pixel electrodes arranged in a matrix-like shape, thin-film transistors for applying driving voltages to the pixel electrodes, and signal lines for operating the thin film transistors.

The color filter substrate 3340 may include a transparent substrate, a color filter, and a common electrode. The color filter may include filters for selectively passing light of specific wavelengths from white light emitted from the backlight unit 3100. The liquid crystal layer 3330 may be rearranged by an electric field formed between the pixel electrode and a common electrode and control light transmittance. Light with adjusted light transmittance may display an image by passing through the color filter of the color filter substrate 3340. The image display panel 3300 may further include a driving circuit unit for processing image signals.

Figure 17:
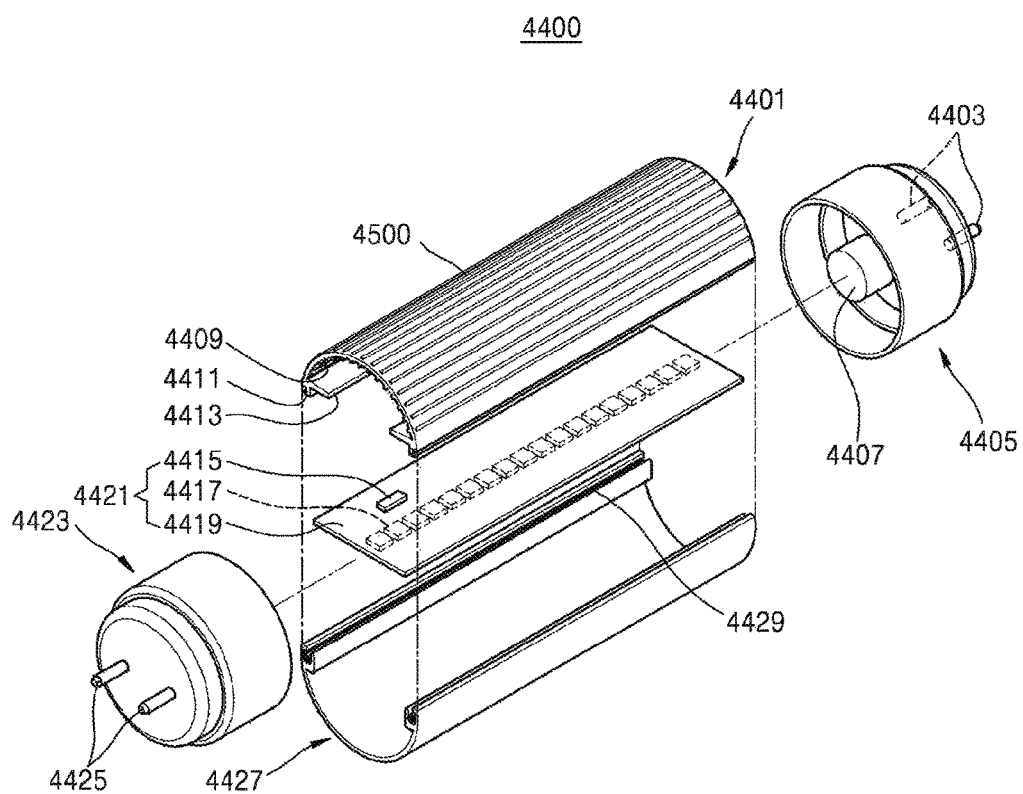
FIG. 17 is a schematic exploded perspective view of a bar-type illumination apparatus including a light-emitting device according to some example embodiments of the inventive concepts.

FIG. 17 is a schematic exploded perspective view of a bar-type illumination apparatus including a light-emitting device according to some example embodiments of the inventive concepts.

Specifically, an illumination apparatus 4400 includes a heat dissipating member 4401, a cover 4427, a light source module 4421, a first socket 4405, and a second socket 4423. A plurality of heat dissipating fins 4500 and 4409 may be disposed on an inner surface and/or an outer surface of the heat dissipating member 4401 in a concavo-convex shape, and the heat dissipating fins 4500 and 4409 may be designed to have various shapes and intervals. On the inner side of the heat dissipating member 4401, a protruding support base 4413 is disposed. The light source module 4421 may be fixed to the support base 4413. At both ends of the heat dissipating member 4401, stopping hooks 4411 may be formed.

Stopping grooves 4429 are disposed at the cover 4427 and the stopping hooks 4411 of the heat dissipating member 4401 may be coupled to the stopping grooves 4429 in a hook-coupling structure. The locations where the stopping grooves 4429 and the stopping hooks 4411 are disposed may be switched.

The light source module 4421 may include a light-emitting device array. The light source module 4421 may include a printed circuit board 4419, a light source 4417, and a controller 4415. The controller 4415 may store driving information regarding the light source 4417. Circuit wirings for operating the light source 4417 are disposed on the printed circuit board 4419. Furthermore, the light source module 4421 may include other components associated with operation the light source 4417. The light source 4417 may be a light-emitting device 10, 20, 30, or 40 according to the above embodiments (Refer to FIGS. 1, 13A, and 14A).

The first and second sockets 4405 and 4423 are a pair of sockets and have structures to be coupled to both ends of a cylindrical cover unit including the heat dissipating member 4401 and the cover 4427. For example, the first socket 4405 may include an electrode terminal 4403 and a power supply 4407, whereas a dummy terminal 4425 may be disposed in the second socket 4423. Furthermore, an optical sensor and/or a communication module may be embedded in either the first socket 4405 or the second socket 4423. For example, an optical sensor and/or a communication module may be embedded in the second socket 4423 where the dummy terminal 4425 is disposed. In another example, an optical sensor and/or a communication module may be embedded in the first socket 4405 in which the electrode terminal 4403 is disposed.

While the inventive concepts has been particularly shown and described with reference to embodiments thereof, it will be understood that various changes in form and details may be made therein without departing from the spirit and scope of the following claims.

What is claimed is:

1. A light-emitting device, comprising:
   a first light-emitting structure and a second light-emitting structure on a phototransmissive substrate, the first light-emitting structure and the second light-emitting structure isolated from direct contact with each other, the first light-emitting structure and the second light-emitting structure each including a first conductivity-type semiconductor layer,
   an active layer on the first conductivity-type semiconductor layer, and a second conductivity-type semiconductor layer on the active layer; and an inter-structure conductive layer configured to electrically interconnect the first conductivity-type semiconductor layer of the first light-emitting structure to the second conductivity-type semiconductor layer of the second light-emitting structure, wherein the second light-emitting structure includes a finger structure extending from an outer edge of the second light-emitting structure toward an interior of the second light-emitting structure,
   wherein the finger structure is restricted to the second light-emitting structure,
   wherein the first light-emitting structure and the second light-emitting structure each include an etched structure, the etched structure including etched portions of the second conductivity-type semiconductor layer, the active layer, and the first conductivity-type semiconductor layer and a plurality of mesa structures partially defined by the etched structure,
   wherein the etched structure at least partially defines the finger structure.

2. The light-emitting device of claim 1, further comprising:
   a first contact electrode on the second conductivity-type semiconductor layer of the first light-emitting structure, the first contact electrode electrically connected to the second conductivity-type semiconductor layer; and
   a first insulation pattern configured to cover at least a portion of the first contact electrode, least a portion of the first light-emitting structure, and at least a portion of the second light-emitting structure,
   wherein a thickness of a particular portion of the first insulation pattern on the first contact electrode is less than a thickness of a separate portion of the first insulation pattern on a particular portion of the second conductivity-type semiconductor layer, the particular portion of the second conductivity-type semiconductor layer isolated from direct contact with the first contact electrode.

3. The light-emitting device of claim 2, wherein,
   the first insulation pattern includes a lower insulation pattern and an upper insulation pattern,
   the lower insulation pattern at least partially covers the second conductivity-type semiconductor layer, and
   the upper insulation pattern covers at least one portion of the second conductivity-type semiconductor layer, the lower insulation pattern, and the first contact electrode, respectively.

4. The light-emitting device of claim 3, wherein the lower insulation pattern isolated from direct contact with from the first contact electrode.

5. The light-emitting device of claim 4, wherein the upper insulation pattern includes a plurality of grooves between the lower insulation pattern and the first contact electrode.

6. The light-emitting device of claim 1, wherein the inter-structure conductive layer is configured to cover an entirety of a plurality of side surfaces of the first light-emitting structure and the second light-emitting structure, such that at least a portion of the inter-structure conductive layer is between the first light-emitting structure and the second light-emitting structure.

7. The light-emitting device of claim 6, wherein the inter-structure conductive layer includes at least one of Ag and Al.

8. A light-emitting device, comprising:
a phototransmissive substrate; and
a first light-emitting structure and a second light-emitting structure on the phototransmissive substrate, the first light-emitting structure and the second light-emitting structure isolated from direct contact with each other in a first direction, the first direction parallel to a surface of the phototransmissive substrate, the first light-emitting structure and the second light-emitting structure each including
a first conductivity-type semiconductor layer,
an active layer on the first conductivity-type semiconductor layer, and
a second conductivity-type semiconductor layer on the active layer,
wherein the first conductivity-type semiconductor layer of the first light-emitting structure and the second conductivity-type semiconductor layer of the second light-emitting structure are configured to be electrically connected to each other, and
wherein the second light-emitting structure includes
a plurality of island structures that are isolated from direct contact with each other in a second direction, the second direction parallel to the surface of the phototransmissive substrate and intersecting with the first direction, and
a bridge structure between adjacent island structures of the plurality of island structures.

9. The light-emitting device of claim 8, wherein the adjacent island structures are connected to each other via the bridge structure.

10. The light-emitting device of claim 8, wherein the first light-emitting structure has an individual island structure.

11. The light-emitting device of claim 8, wherein a first edge of the bridge structure and a plurality of first edges of the plurality of island structures are collinear.

12. The light-emitting device of claim 8, wherein a sum of a length of the bridge structure and a plurality of lengths of the plurality of island structures along the second direction is substantially identical to a length of the first light-emitting structure along the second direction.

13. A light-emitting device, comprising:
a first light-emitting structure on a phototransmissive substrate; and
a second light-emitting structure on the phototransmissive substrate, the second light-emitting structure isolated from direct contact with the first light-emitting structure, the second light-emitting structure including a plurality of island structures that are isolated from direct contact with each other, and a bridge structure between adjacent island structures of the plurality of island structures,
wherein the first light-emitting structure and the second light-emitting structure are configured to be electrically connected to each other.

14. The light-emitting device of claim 13, wherein,
the first light-emitting structure and the second light-emitting structure each include a first conductivity-type semiconductor layer, an active layer on the first conductivity-type semiconductor layer, and a second conductivity-type semiconductor layer on the active layer, and
the first conductivity-type semiconductor layer of the first light-emitting structure and the second conductivity-type semiconductor layer of the second light-emitting structure are configured to be electrically connected to each other.

15. The light-emitting device of claim 14, further comprising:
an inter-structure conductive layer configured to electrically interconnect the first conductivity-type semiconductor layer of the first light-emitting structure to the second conductivity-type semiconductor layer of the second light-emitting structure.

16. The light-emitting device of claim 15, further comprising:
a first contact electrode on the second conductivity-type semiconductor layer of the first light-emitting structure, the first contact electrode electrically connected to the second conductivity-type semiconductor layer; and
a first insulation pattern configured to cover at least a portion of the first contact electrode, at least a portion of the first light-emitting structure, and at least a portion of the second light-emitting structure,
wherein a thickness of a particular portion of the first insulation pattern on the first contact electrode is less than a thickness of a separate portion of the first insulation pattern on a particular portion of the second conductivity-type semiconductor layer, the particular portion of the second conductivity-type semiconductor layer isolated from direct contact with the first contact electrode.

17. The light-emitting device of claim 16, wherein,
the first insulation pattern includes a lower insulation pattern and an upper insulation pattern,
the lower insulation pattern at least partially covers the second conductivity-type semiconductor layer, and
the upper insulation pattern covers at least one portion of the second conductivity-type semiconductor layer, the lower insulation pattern, and the first contact electrode, respectively.

* * * * *